US012633371B2

(12) United States Patent
Choi et al.

(10) Patent No.: US 12,633,371 B2
(45) Date of Patent: May 19, 2026

(54) STORAGE DEVICE AND METHOD OF OPERATING STORAGE DEVICE

(71) Applicant: SAMSUNG ELECTRONICS CO., LTD., Suwon-si (KR)

(72) Inventors: Seonghyeog Choi, Suwon-si (KR); Changkyu Seol, Suwon-si (KR); Taemin Lee, Suwon-si (KR); Daewook Kim, Suwon-si (KR); Dongjin Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 18/653,688

(22) Filed: May 2, 2024

(65) Prior Publication Data

US 2025/0174297 A1     May 29, 2025

(30) Foreign Application Priority Data

Nov. 28, 2023    (KR) ........................ 10-2023-0167503

(51) Int. Cl.
  *G11C 29/52*          (2006.01)
  *G11C 29/00*          (2006.01)
(52) U.S. Cl.
  CPC ............ *G11C 29/789* (2013.01); *G11C 29/52* (2013.01); *G11C 29/76* (2013.01)
(58) Field of Classification Search
  CPC ....... G11C 29/789; G11C 29/52; G11C 29/76; G11C 2029/0409; G11C 2029/0411; G11C 29/42
  See application file for complete search history.

(56) References Cited

U.S. PATENT DOCUMENTS

| | | | |
|---|---|---|---|
| 7,437,593 B2 | 10/2008 | Johnson et al. | |
| 8,082,469 B2 | 12/2011 | Kobayashi et al. | |
| 8,448,042 B2 | 5/2013 | Spraul | |
| 9,507,675 B2 | 11/2016 | Chun et al. | |
| 9,934,085 B2 | 4/2018 | Yoon et al. | |
| 10,956,258 B2 | 3/2021 | Flynn et al. | |
| 11,231,992 B2 | 1/2022 | Park et al. | |
| 2021/0026728 A1* | 1/2021 | Kim ..................... | G06F 11/0793 |
| 2021/0026732 A1* | 1/2021 | Park ................... | G11C 29/4401 |
| 2022/0100395 A1* | 3/2022 | Kim ....................... | G11C 29/42 |

FOREIGN PATENT DOCUMENTS

CN          115168088          10/2022

* cited by examiner

*Primary Examiner* — Mohammed A Bashar
(74) *Attorney, Agent, or Firm* — Fish & Richardson P.C.

(57)          ABSTRACT

A storage device includes at least one nonvolatile memory device, a volatile memory device and a storage controller. The storage controller performs an error correction code (ECC) decoding on a read data read from the volatile memory device, in response to uncorrectable errors being detected in the read data, corrects the uncorrectable errors that are not correctable by the ECC decoding to generate corrected data by performing an erasure decoding on the read data, replaces a defective word-line of a first memory region with a redundancy word-line of a second memory region by performing a soft post package repair PPR on the first memory region that stores the read data, stores the corrected data in the second memory region and performs a re-read operation on the second memory region.

20 Claims, 19 Drawing Sheets

50

300

510a

<u>S160</u>

| | |
|---|---|
| WRITE DATA PATTERN IN A MEMORY LOCATION IN WHICH UE OCCURS | S161 |
| READ DATA PATTERN FROM THE MEMORY LOCATION | S163 |
| DETERMINE AT LEAST ONE ERASURE LOCATION BASED ON THE READ DATA PATTERN | S165 |

STORAGE DEVICE AND METHOD OF OPERATING STORAGE DEVICE

CROSS-REFERENCE TO RELATED APPLICATION

This application claims priority to Korean Patent Application No. 10-2023-0167503, filed in the Korean Intellectual Property Office (KIPO) on Nov. 28, 2023, the disclosure of which is incorporated herein by reference in its entirety.

BACKGROUND

Semiconductor memories may be classified into volatile memory devices, such as static random access memory (SRAM) or dynamic random access memory (DRAM), in which stored data is lost when power is interrupted, and nonvolatile memory devices, such as flash memory, phase-change RAM (PRAM), magnetic RAM (MRAM), resistive RAM (RRAM), or ferroelectric RAM (FRAM), in which stored data is retained even when power is interrupted.

Solid state drives (SSD) based on flash memory are widely used as high-capacity storage mediums of computing devices. SSDs are typically configured to store data to flash memory, and use a dynamic random access memory (DRAM) device as buffer memory for the purpose of storing various information for managing the flash memory. In the case where a fault is detected a DRAM device in the process of manufacturing the DRAM device, a faulty cell may be repaired through various repair schemes. However, in the case where a fault occurs in a DRAM device after the DRAM device is completely manufactured and mounted in an SSD device (i.e., in the case where the SSD device is provided to and used by an end user), the SSD device in addition to the DRAM device fail to operate normally.

SUMMARY

In general, in some aspects, the present disclosure is directed toward a storage device having enhanced performance and improved lifespan.

According to some aspects, the present disclosure is directed to a storage device that includes at least one nonvolatile memory device, a volatile memory device and a storage controller to control the at least one nonvolatile memory device and the volatile memory device. The storage controller performs an error correction code (ECC) decoding on a read data read from the volatile memory device, in response to uncorrectable errors being detected in the read data, corrects the uncorrectable errors that are not correctable by the ECC decoding to generate corrected data by performing an erasure decoding on the read data, replaces a defective word-line of a first memory region with a redundancy word-line of a second memory region by performing a soft post package repair PPR on the first memory region that stores the read data, stores the corrected data in the second memory region and performs a re-read operation on the second memory region.

According to some aspects, the present disclosure is directed toward a method of operating a storage device that includes at least one nonvolatile memory device, a volatile memory device and a storage controller to control the at least one nonvolatile memory device and the volatile memory device, an error correction code (ECC) decoding is performed on a read data read from the volatile memory device, in response to uncorrectable errors being detected in the read data, the uncorrectable errors that are uncorrectable by the ECC decoding, are generated to generate corrected data by performing an erasure decoding on the read data, and a defective word-line of a first memory region is replaced by the volatile memory device with a redundancy word-line of a second memory region by performing a soft post package repair (PPR) on the first memory region that stores the read data.

According to some aspects, the present disclosure is directed to a storage device that includes at least one nonvolatile memory device, a volatile memory device and a storage controller to control the at least one nonvolatile memory device and the volatile memory device. The storage controller includes a memory controller, an error correction code (ECC) decoder, an uncorrectable error (UE) data buffer and an erasure decoder. The memory controller performs an access operation on the volatile memory device. The ECC decoder receives the read data from the memory controller, performs the ECC decoding on the read data and activates an error flag signal in response to the uncorrectable errors being detected in the read data. The UE data buffer store the read data in which the uncorrectable errors are detected. The erasure decoder corrects the uncorrectable errors to generate corrected data by performing an erasure decoding on the read data stored in the UE data buffer. The memory controller replaces a defective word-line of a first memory region with a redundancy word-line of a second memory region by performing a soft post package repair on the first memory region that stores the read data in the volatile memory device, based on a result of the erasure decoding, stores the corrected data in the second memory region and performs a re-read operation on the second memory region.

According to some aspects, the present disclosure is directed toward a storage device and a method of operating the storage device, that when uncorrectable errors, which cannot be corrected by an ECC, are detected in the read data from the volatile memory device, the storage controller may correct the uncorrectable errors by performing an erasure decoding on the read data, may perform a soft PPR on the volatile memory device based on a result of the erasure decoding, may store a corrected data in a redundancy region, and may re-read data stored in the redundancy region. Accordingly, even if errors that cannot be corrected by ECC are detected in the data read from the volatile memory device, recovery is possible during a run-time of the storage device, thereby improving performance and lifespan of the storage device.

BRIEF DESCRIPTION OF THE DRAWINGS

FIG. 16 is a circuit diagram illustrating one of the memory blocks of FIG. 15 according to some implementations.

DETAILED DESCRIPTION

Hereinafter, example implementations will be explained in detail with reference to the accompanying drawings.

Figure 1:
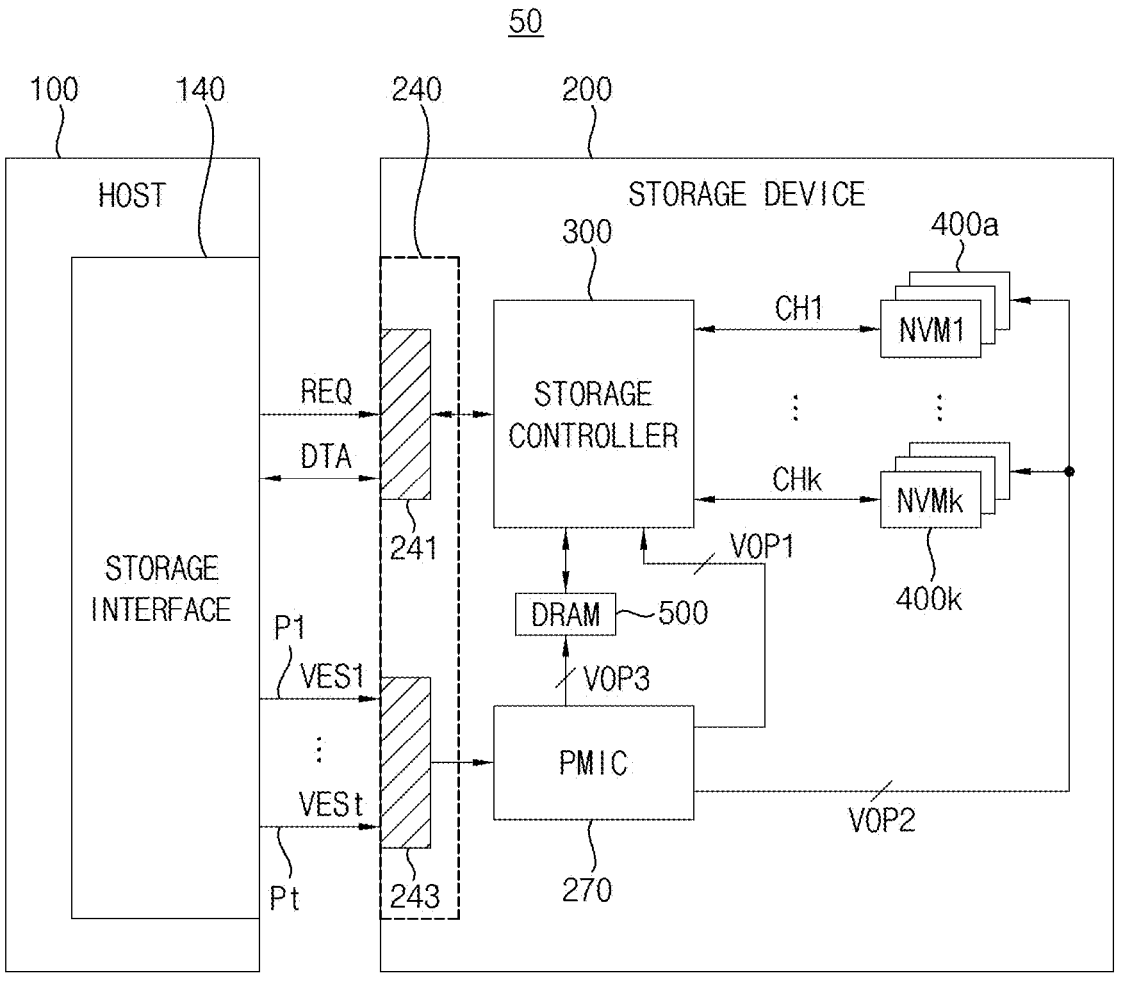
FIG. 1 is a block diagram illustrating an example of a storage system according to some implementations.

FIG. 1 is a block diagram illustrating an example of storage system according to some implementations. In FIG. 1, a storage system 50 may include a host 100 and a storage device 200. The host 100 may include a storage interface 140.

The storage device 200 may be any kind of storage devices. The storage device 200 may include a storage controller 300, a plurality of nonvolatile memory devices (NVM1-NVMk) 400a-400k (where k is an integer greater than two), a power management integrated circuit (PMIC) 270 and a host interface 240. The host interface 240 may include a signal connector 241 and a power connector 243. The storage device 200 may further include a dynamic random access memory DRAM device 500. The DRAM device 500 may be referred to as a volatile memory device.

The plurality of nonvolatile memory devices 400a-400k may be used as a storage medium of the storage device 200.

In some implementations, each of the plurality of nonvolatile memory devices 400a-400k may include a flash memory or a vertical NAND memory device. The storage controller 300 may be coupled to the plurality of nonvolatile memory devices 400a-400k through a plurality of channels CHG1-CHGk, respectively.

The storage controller 300 may be configured to receive a request REQ from the host 100 and communicate data DTA with the host 100 through the signal connector 241. The storage controller 300 may write data DTA to the plurality of nonvolatile memory devices 400a-400k or read the data DTA from plurality of nonvolatile memory devices 400a-400k based on the request REQ.

The storage controller 300 may communicate the data DTA with the host 100 using the volatile memory device 500 as an input/output buffer.

The PMIC 270 may be configured to receive a plurality of power supply voltages (i.e., external supply voltages) VES1-VESt from the host 100 through the power connector 243. For example, the power connector 243 may include a plurality of power lines P1-Pt, and the PMIC 270 may be configured to receive the plurality of power supply voltages VES1-VESt from the host 100 through the plurality of power lines P-Pt, respectively. Here, t represents a positive integer greater than one.

The PMIC 270 may generate at least one first operating voltage VOP1 used by the storage controller 300, at least one second operating voltage VOP2 used by the plurality of nonvolatile memory devices 400a-400k, and at least one third operating voltage VOP3 used by the buffer memory 250 based on the plurality of power supply voltages VES1-VESt.

For example, when the PMIC 270 receives all of the plurality of power supply voltages VES1-VESt from the host 100, the PMIC 270 may generate the at least one first operating voltage VOP1, the at least one second operating voltage VOP2, and the at least one third operating voltage VOP3 using all of the plurality of power supply voltages VES1-VESt. On the other hand, when the PMIC 270 receives less than all of the plurality of power supply voltages VES1-VESt from the host 100, the PMIC 270 may generate the at least one first operating voltage VOP1, the at least one second operating voltage VOP2, and the at least one third operating voltage VOP3 using all of the part of the plurality of power supply voltages VES1-VESt that is received from the host 100.

Figure 2:
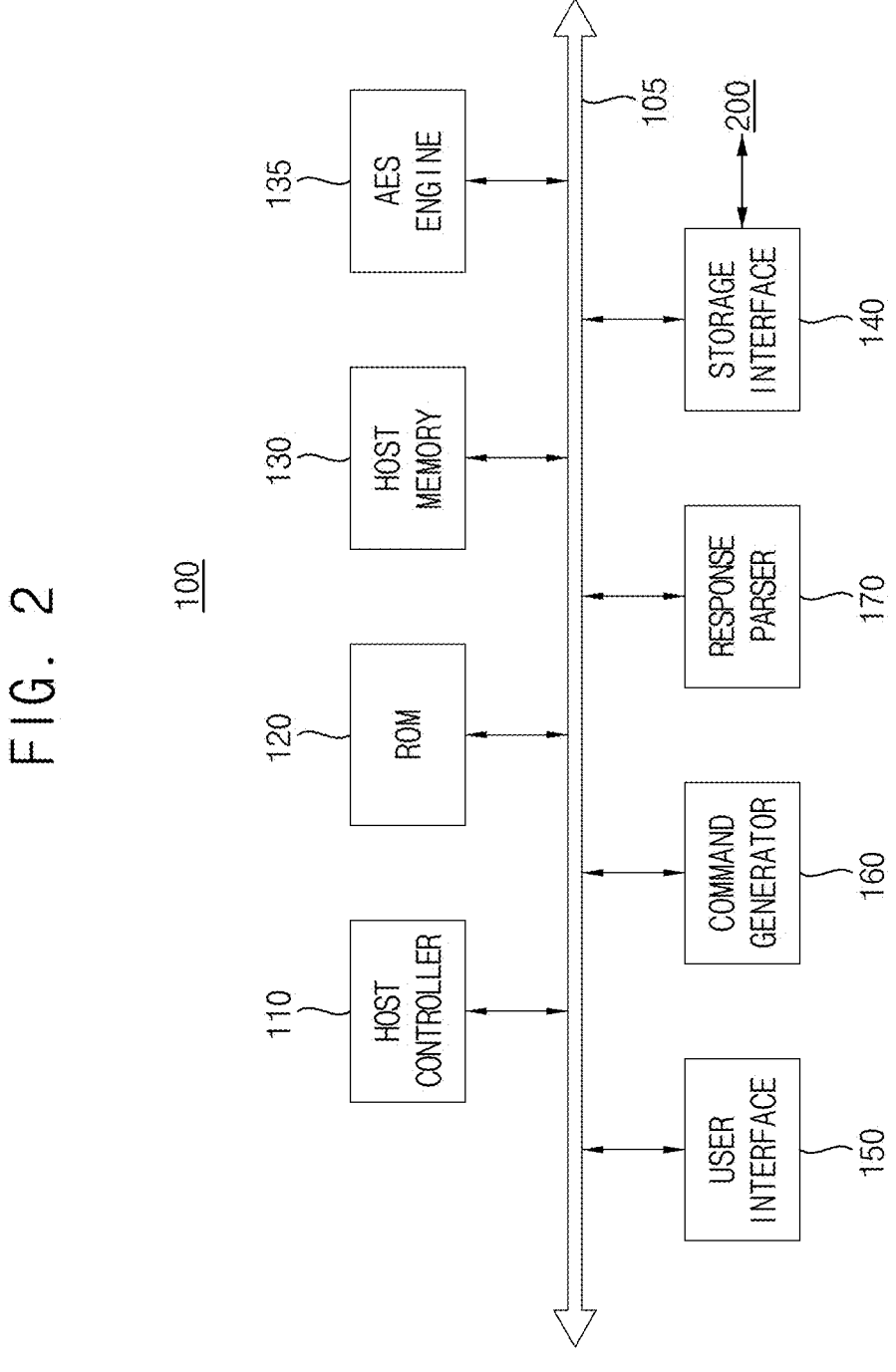
FIG. 2 is a block diagram illustrating an example of a host in FIG. 1 according to some implementations.

FIG. 2 is a block diagram illustrating an example of a host in FIG. 1 according to some implementations. In FIG. 2, the host 100 may include a host controller 110, a read-only memory (ROM) 120, a host memory 130, an advanced encryption standard (AES) engine 135, the storage interface 140, a user interface 150, a command generator 160, a response parser 170 and a bus 105.

The bus 105 may refer to a transmission channel via which data is transmitted between the host controller 110, the ROM 120, the host memory 130, the AES engine 135, the storage interface 140, the user interface 150, the command generator 160 and the response parser 170 of the host 100.

The ROM 120 may store various application programs. For example, application programs supporting storage protocols such as Advanced Technology Attachment (ATA), Small Computer System Interface (SCSI), embedded Multi Media Card (eMMC), and/or Universal flash storage (UFS) protocols are stored.

The host memory 130 may temporarily store data or programs. The host memory 130 may include a submission queue and a completion queue. The user interface 150 may be a physical or virtual medium for exchanging information between a user and the host device 100, a computer program, etc., and includes physical hardware and logical software. For example, the user interface 150 may include an input device for allowing the user to manipulate the host 100, and an output device for outputting a result of processing an input of the user.

The host controller 110 may control overall operations of the host 100. The host controller 110 may generate a command for storing data in the storage device 200 or a request (or a command) for reading data from the storage device 200 by using an application stored in the ROM 120, and may transmit the request to the storage device 200 via the storage interface 140. The host controller 110 may generate plurality of power supply voltages VES1-VESt.

The AES engine 135 may perform an encryption operation on data provided from the storage device 200 and may perform a decryption operation on data received from the storage device by using a symmetric-key algorithm.

The command generator 160 may generate a command designating an operation to be performed in the storage device 200. The command, generated by the command generator 160, may be transmitted to the storage device 200 through the storage interface 140.

The command generator 160 may generate various kinds of commands such as a read command, a write command and an erase command. The read command may designate an operation of reading data stored in the storage device 200. The write command may designate an operation of writing data in the storage device 200. The erase command may designate an operation of physically erasing data stored in the storage device 200.

The response parser 1740 may analyze a response received from the storage device 200.

Figure 3:
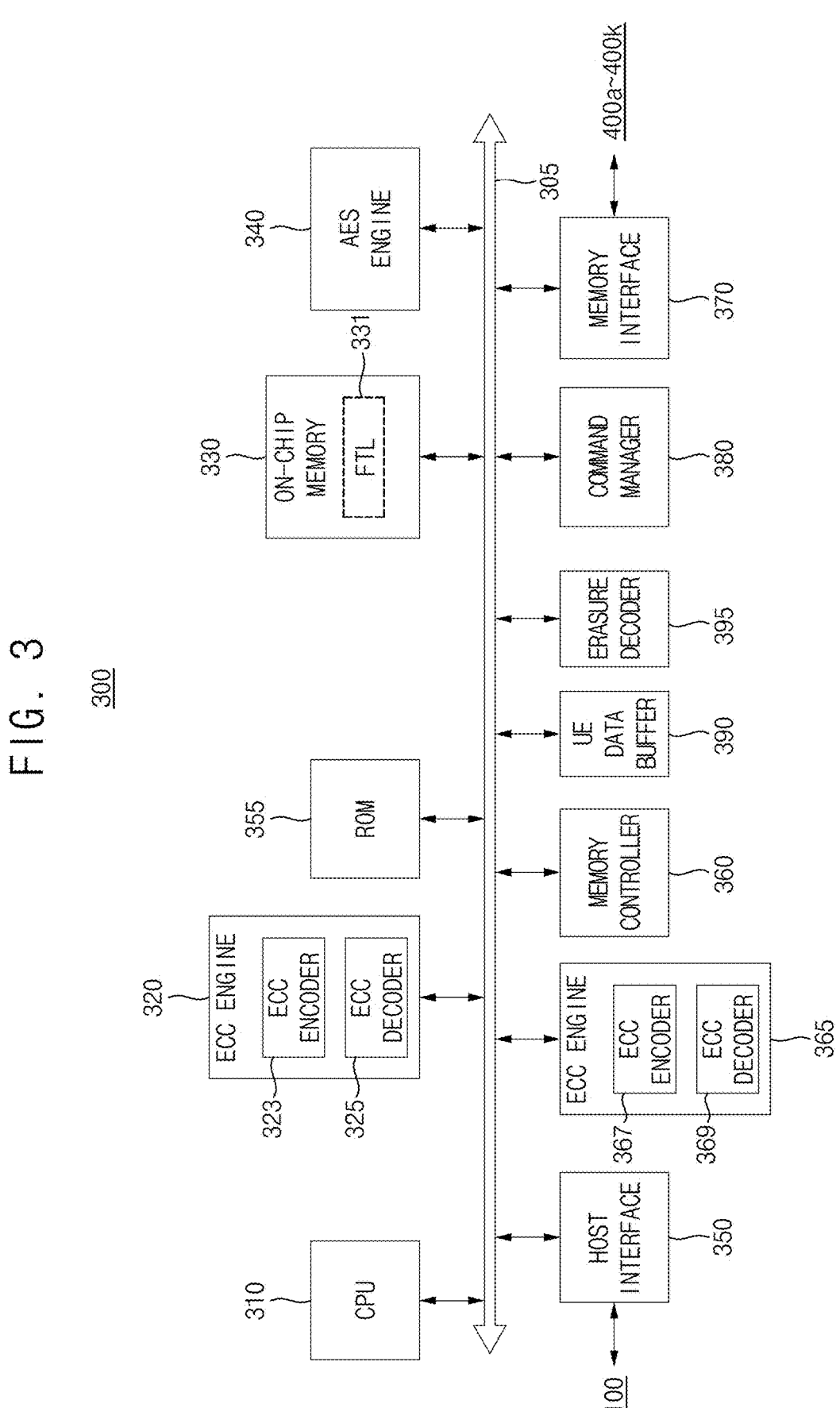
FIG. 3 is a block diagram illustrating an example of a storage controller in the storage device in FIG. 1 according to some implementations.

FIG. 3 is a block diagram illustrating an example of a storage controller in the storage device in FIG. 1 according to some implementations. In FIG. 3, the storage controller 300 may include a central processing unit (CPU) 310, an error correction code (ECC) engine 320, an on-chip memory 330, an AES engine 340, a host interface 350, a ROM 355, a memory controller 360, an ECC engine 365, a command manager 380, a uncorrectable error (UE) data buffer 390, an erasure decoder 395, and a memory interface 370 which are connected via a bus 305.

The CPU 310 may control an overall operation of the storage controller 300. The CPU 310 may control the ECC engine 320, the on-chip memory 330, the AES engine 340, the host interface 350, the ROM 355, the memory controller 360, the ECC engine 365, the command manager 380, the UE data buffer 390, the erasure decoder 395 and the memory interface 370.

The CPU 310 may include one or more cores (e.g., a homogeneous multi-core or a heterogeneous multi-core). The CPU 310 may be or include, for example, at least one of an image signal processing unit (ISP), a digital signal processing unit (DSP), a graphics processing unit (GPU), a vision processing unit (VPU), and a neural processing unit (NPU). The CPU 310 may execute various application programs (e.g., a flash translation layer (FTL) 331 and firmware) loaded onto the on-chip memory 330.

The on-chip memory 330 may store various application programs that are executable by the CPU 310. The on-chip memory 330 may operate as a cache memory adjacent to the CPU 310. The on-chip memory 330 may store a command, an address, and data to be processed by the CPU 310 or may store a processing result of the CPU 310. The on-chip memory 330 may be, for example, a storage medium or a working memory including a latch, a register, a static random access memory (SRAM), a dynamic random access memory (DRAM), a thyristor random access memory (TRAM), a tightly coupled memory (TCM), etc.

The CPU 310 may execute the FTL 331 loaded onto the on-chip memory 330. The FTL 331 may be loaded onto the on-chip memory 330 as firmware or a program stored in the one of the nonvolatile memory devices 400a-400k. The FTL 331 may manage mapping between a logical address provided from the host 100 and a physical address of the nonvolatile memory devices 400a-400k and may include an address mapping table manager managing and updating an address mapping table. The FTL 331 may further perform a garbage collection operation, a wear leveling operation, and the like, as well as the address mapping described above. The FTL 331 may be executed by the processor 310 for addressing one or more of the following aspects of the nonvolatile memory devices 400a-400k: overwrite- or in-place write-impossible, a life time of a memory cell, a limited number of program-erase (PE) cycles, and an erase speed slower than a write speed.

Memory cells of the nonvolatile memory devices 400a-400k may have the physical characteristic that a threshold voltage distribution varies due to causes, such as a program elapsed time, a temperature, program disturbance, read disturbance and etc. For example, data stored at the nonvolatile memory devices 400a-400k becomes erroneous due to the above causes.

The storage controller 300 may utilize a variety of error correction techniques to correct such errors. For example, the storage controller 300 may include the ECC engine 320. The ECC engine 320 may correct errors which occur in the data stored in the nonvolatile memory devices 400a-400k. The ECC engine 320 may include an ECC encoder 323 and an ECC decoder 325. The ECC encoder 323 may perform an ECC encoding operation on data to be stored in the nonvolatile memory devices 400a-400k. The ECC decoder 325 may perform an ECC decoding operation on data read from the nonvolatile memory devices 400a-400k.

The ROM 355 may store a variety of information, needed for the storage controller 300 to operate, in firmware.

The AES engine 340 may perform at least one of an encryption operation and a decryption operation on data input to the storage controller 300 by using a symmetric-key algorithm. I AES engine 340 may include an encryption module and a decryption module. For example, the encryption module and the decryption module may be implemented as separate modules. For another example, one module capable of performing both encryption and decryption operations may be implemented in the AES engine 340.

The command manager 380 may manage the command received from the host 100. The memory controller 360 may perform access operation on the volatile memory device 500. The memory controller 360 may provide data to be stored in the volatile memory device 500 to the ECC engine 365 and may provide data received from the volatile memory device 500 to the ECC engine 365.

The ECC engine 365 may include an ECC encoder 367 and an ECC decoder 369. The ECC encoder 367 may generate parity bits by performing an ECC encoding on the data to be stored in the volatile memory device 500 and may provide the parity bits to the memory controller 360. The memory controller 360 may provide the data and the parity bits to the volatile memory device 500.

The memory controller 360 may provide the ECC decoder 369 with read data and parity bits read from the volatile memory device 500. The ECC decoder 369 may correct error bits in the read data by unit of a symbol by performing an ECC decoding on the read data based on the parity bits and may provide the memory controller 360 with an error flag signal indicating that uncorrectable errors are detected in the read data when the uncorrectable errors are detected in the read data, which may not be corrected by the ECC decoding. When the uncorrectable errors are detected in the read data, the ECC decoder 369 may store the read data in the UE data buffer 390. The symbol may refer to a data unit including a predetermined number of data bits.

In response to the error flag signal being activated, the memory controller 360 may store the read data in the UE data buffer 390. The memory controller 360 may write a data pattern in a first memory region of the volatile memory device 500, may read data pattern from the first memory region and may provide the written data pattern and the read data pattern to the erasure decoder 395.

The erasure decoder 395 may determine at least one erasure location based on the read data pattern, may correct the uncorrectable errors to generate corrected data by performing an erasure decoding on the read data and may provide the memory controller 360 with the corrected data and a result of the erasure decoding.

The memory controller 360 may replace a defective word-line of a first memory region with a redundancy word-line of a second memory region, may copy data (i.e., specific size of data including uncorrectable errors which are stored in memory cells coupled to a defective word-line) of the first memory region to the second memory region and may replace a defective word-line of the first memory region with a redundancy word-line of the second memory region by performing a soft post package repair PPR on the first memory region that stores the read data by performing a soft post package repair PPR on the first memory region. The memory controller 360 may read data stored in the second memory region by performing re-read operation on the second memory region in response to a command designating the re-read operation from the CPU 310 and may provide the read data (that includes the corrected data) to the CPU 310.

The storage controller 300 may communicate with the host 100 through the host interface 350. For example, the host interface 350 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The storage controller 300 may communicate with the nonvolatile memory devices 400a-400k through the memory interface 370.

Figure 4:
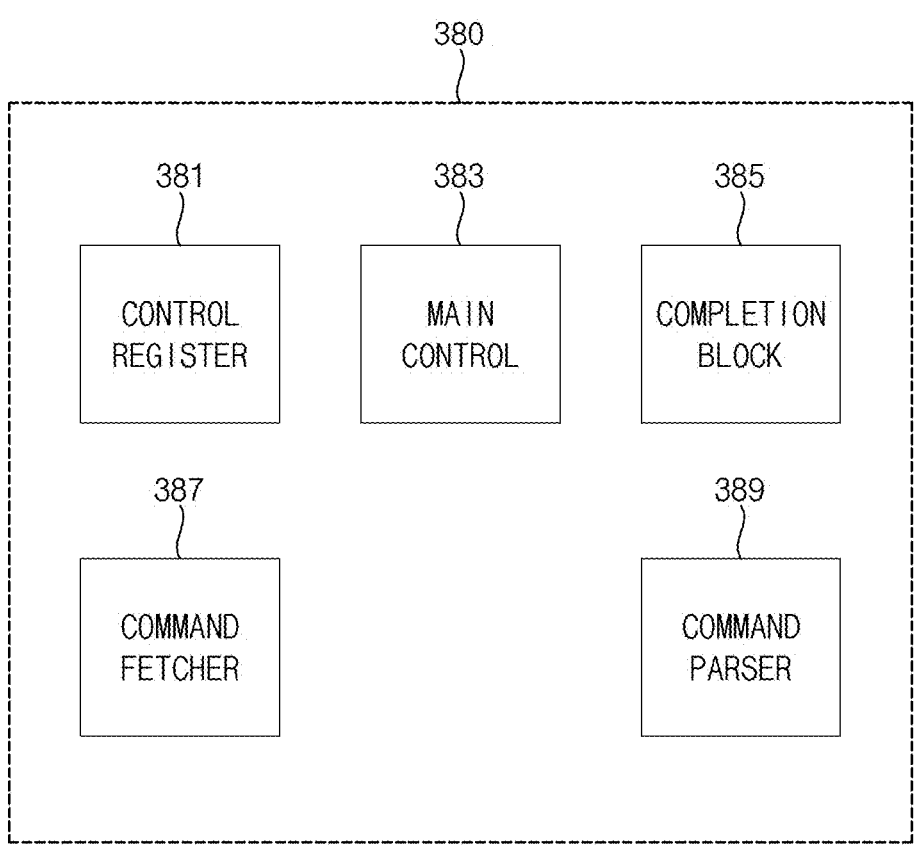
FIG. 4 is a block diagram illustrating an example of a command manager in the storage controller of FIG. 3 according to some implementations.

FIG. 4 is a block diagram illustrating an example of a command manager in the storage controller of FIG. 3 according to some implementations. In FIG. 4, the command manager 380 may include a control register block 381, a main control block 383, a completion block 385, a command fetch block (i.e., a command fetcher) 387 and a command parser 389.

The control register block 381 may be configured to include a register capable of being set by the host 100 or to process one or a series of operations for recognizing a register value set by the host 100. For example, the control register block 381 may include various registers for determining information provided from the host 100. The host 100 may notify the command manager 380 of various information by setting a register value of the control register block 381.

The command fetch block 387 may perform or process one or a series of operations for fetching a command stored in the submission queue of the host 100. For example, the command fetch block 387 may transmit a memory read request to the host 100 and may receive a command stored in the submission queue from the host 100.

The main control block 383 may control overall operations of the command manager 380 or may process one or a series of operations to be performed in the command manager 380.

The command parser 389 may parse the command from the host 100 and may provide the parsed command to one of the nonvolatile memory devices 400a-400k through the memory interface 370.

The completion block 385 may process one or a series of operations of writing completion information indicating that an operation is completed, to the completion queue of the host 100. For example, when an operation associated with a command fetched from the host 100 is completed, the completion block 385 may write the completion information indicating that the operation is completed, to the completion queue of the host 100.

Figure 5:
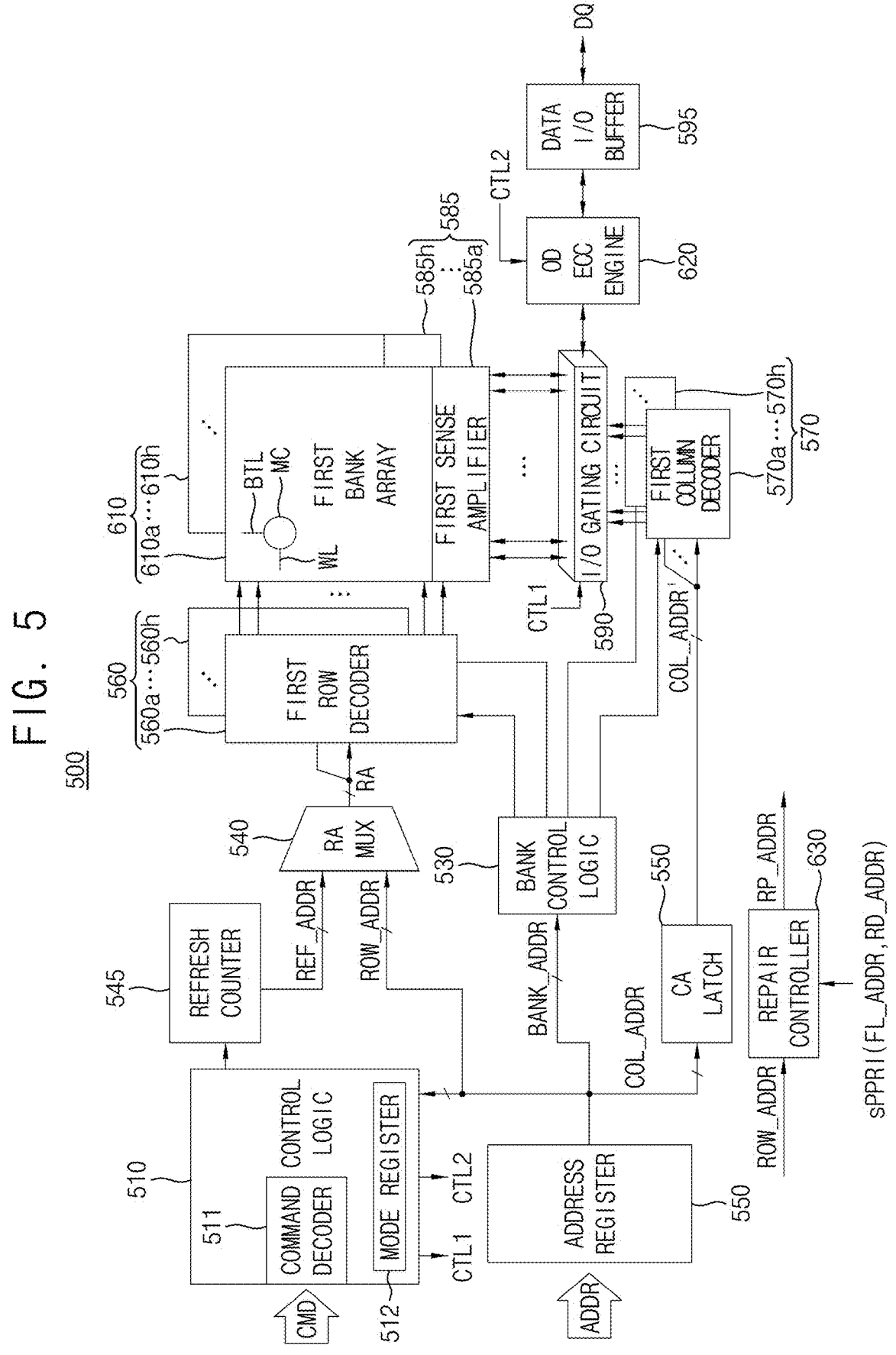
FIG. 5 is a block diagram illustrating an example of a volatile memory device in the storage device in FIG. 1 according to some implementations.

FIG. 5 is a block diagram illustrating an example of a volatile memory device in the storage device in FIG. 1 according to some implementations. In FIG. 5, the volatile memory device 500 may include a control logic circuit 510, an address register 520, a bank control logic circuit 530, a row address multiplexer 540, a column address latch 550, a row decoder 560, a column decoder 570, a memory cell array 610, a sense amplifier unit 585, an input/output (I/O) gating circuit 590, an on-die ECC engine 620, a data input/output (I/O) buffer 595, a refresh counter 545 and a repair controller 630.

In some implementations, the on-die ECC engine 620 may not be included in the volatile memory device 500.

The memory cell array 610 may include first through eighth bank arrays 610a-610h.

The row decoder 560 may include first through eighth bank row decoders 560a-560h coupled to the first through eighth bank arrays 610a-610h, respectively, the column decoder 570 may include first through eighth bank column decoders 570a-570h coupled to the first through eighth bank arrays 610a-610h, respectively, and the sense amplifier unit 585 may include first through eighth bank sense amplifiers 585a-585h coupled to the first through eighth bank arrays 610a-610h, respectively.

The first through eighth bank arrays 610a-610h, the first through eighth bank row decoders 560a-560h, the first through eighth bank column decoders 570a-570h, and the first through eighth bank sense amplifiers 585a-585h may form first through eighth banks. Each of the first through eighth bank arrays v may include a plurality of word-lines WL, a plurality of bit-lines BL, and a plurality of memory cells MC formed at intersections of the word-lines WL and the bit-lines BTL.

Although the volatile memory device 500 is shown in FIG. 5 as including eight banks, the volatile memory device 500 may include any number of banks.

The address register 520 may receive the address ADDR including a bank address BANK_ADDR, a row address ROW_ADDR, and a column address COL_ADDR from the memory controller 360. The address register 520 may provide the received bank address BANK_ADDR to the bank control logic 530, may provide the received row address ROW_ADDR to the row address multiplexer 540, and may provide the received column address COL_ADDR to the column address latch 550.

The bank control logic 530 may generate bank control signals in response to the bank address BANK_ADDR. One of the first through eighth bank row decoders 560a-560h corresponding to the bank address BANK_ADDR may be activated in response to the bank control signals, and one of the first through eighth bank column decoders 570a-570h corresponding to the bank address BANK_ADDR may be activated in response to the bank control signals.

The row address multiplexer 540 may receive the row address ROW_ADDR from the address register 520, and may receive a refresh row address REF_ADDR from the refresh counter 545. The row address multiplexer 540 may selectively output the row address ROW_ADDR or the refresh row address REF_ADDR as a row address RA. The row address RA that is output from the row address multiplexer 540 may be applied to the first through eighth bank row decoders 560a-560h.

The activated one of the first through eighth bank row decoders 560a-560h may decode the row address RA that is output from the row address multiplexer 540, and may activate a word-line WL corresponding to the row address RA. For example, the activated bank row decoder may generate a word-line driving voltage and may apply the word-line driving voltage to the word-line WL corresponding to the row address RA.

The column address latch 550 may receive the column address COL_ADDR from the address register 520, and may temporarily store the received column address COL_ADDR. In example implementations, in a burst mode, the column address latch 550 may generate column addresses COL_ADDR' that increments from the received column address COL_ADDR. The column address latch 550 may apply the temporarily stored or generated column address COL_ADDR' to the first through eighth bank column decoders 570a-570h.

The activated one of the first through eighth bank column decoders 570a-570h may decode the column address COL_ADDR that is output from the column address latch 550, and may control the I/O gating circuit 590 to output data corresponding to the column address COL_ADDR.

The I/O gating circuit 590 may include circuitry for gating input/output data. The I/O gating circuit 590 may further include read data latches for storing data that is output from the first through eighth bank arrays 610a-610h, and write control devices for writing data to the first through eighth bank arrays 610a-610h.

Codeword read from one of the first through eighth bank arrays 610a-610h may be sensed by a sense amplifier coupled to the one bank array from which the data is to be read, and may be stored in the read data latches.

The codeword stored in the read data latches may be provided to the on-die ECC engine 620. The on-die ECC engine 620 may perform an ECC decoding on the codeword to generate data DQ and provide the data to the data I/O buffer 595. The data I/O buffer 595 may provide the data to the memory controller 360.

The data DQ to be written in one of the first through eighth bank arrays 610a-610h may be provided to the data I/O buffer 595 from the memory controller 360. The data I/O buffer 595 may provide the data DQ to the on-die ECC engine 620, and the on-die ECC engine 620 may generate second parity bits based on the data DQ and may provide the I/O gating circuit 590 with a codeword including the data and the second parity bits. The I/O gating circuit 590 may write the codeword in a sub-page of the bank array through the write drivers.

The on-die ECC engine 620, in a write operation, may generate the second parity bits by performing an ECC encoding on the data DQ from the data I/O buffer 595 and may store a codeword including the data DQ and the second parity bits in a target page of the memory cell array 610.

The on-die ECC engine 620, in a read operation, may read the codeword including the data and the second parity bits from the target page, may detect at least one error bit in the data set by performing an ECC decoding on the data based on the second parity bits and may output a corrected data to the data I/O buffer 595, when at least one error bit is detected in the data.

The repair controller 630 may store information sPPRI on the soft PPR. The information sPPRI on the soft PPR may include information on a defective address FL_ADDR of a defective word-line of the first memory region and a replacement address RP_ADDR of a redundancy word-line of the second memory region. The repair controller 630 may compare the row address ROW_ADDR corresponding to an access address with the defective address FL_ADDR and may perform a run-time repair to output the replacement address RP_ADDR replacing the defective address FL_ADDR to the row decoder 560 in response to the row address ROW_ADDR matching the defective address FL_ADDR. That is, the repair controller 630 may perform a soft PPR that replaces the defective address FL_ADDR of the first memory region with the replacement address RP_ADDR of the second memory region.

The control logic circuit 510 may control operations of the volatile memory device 500. For example, the control logic circuit 510 may generate control signals for the volatile memory device 500 to perform the write operation or the read operation. The control logic circuit 510 may include a command decoder 511 that decodes the command CMD received from the memory controller 360 and a mode register 512 that sets an operation mode of the volatile memory device 500.

For example, the command decoder 511 may generate the control signals corresponding to the command CMD by decoding a write enable signal, a row address strobe signal, a column address strobe signal, a chip select signal, etc.

The control logic circuit 510 may generate a first control signal CTL1 to control the I/O gating circuit 590 and a second control signal CTL2 to control the on-die ECC engine 620 by decoding the command CMD.

When the on-die ECC engine 620 is not included in the volatile memory device 500, the control logic circuit 510 may generate the first control signal CTL1 to control the I/O gating circuit 590 by decoding the command CMD.

Figure 6:
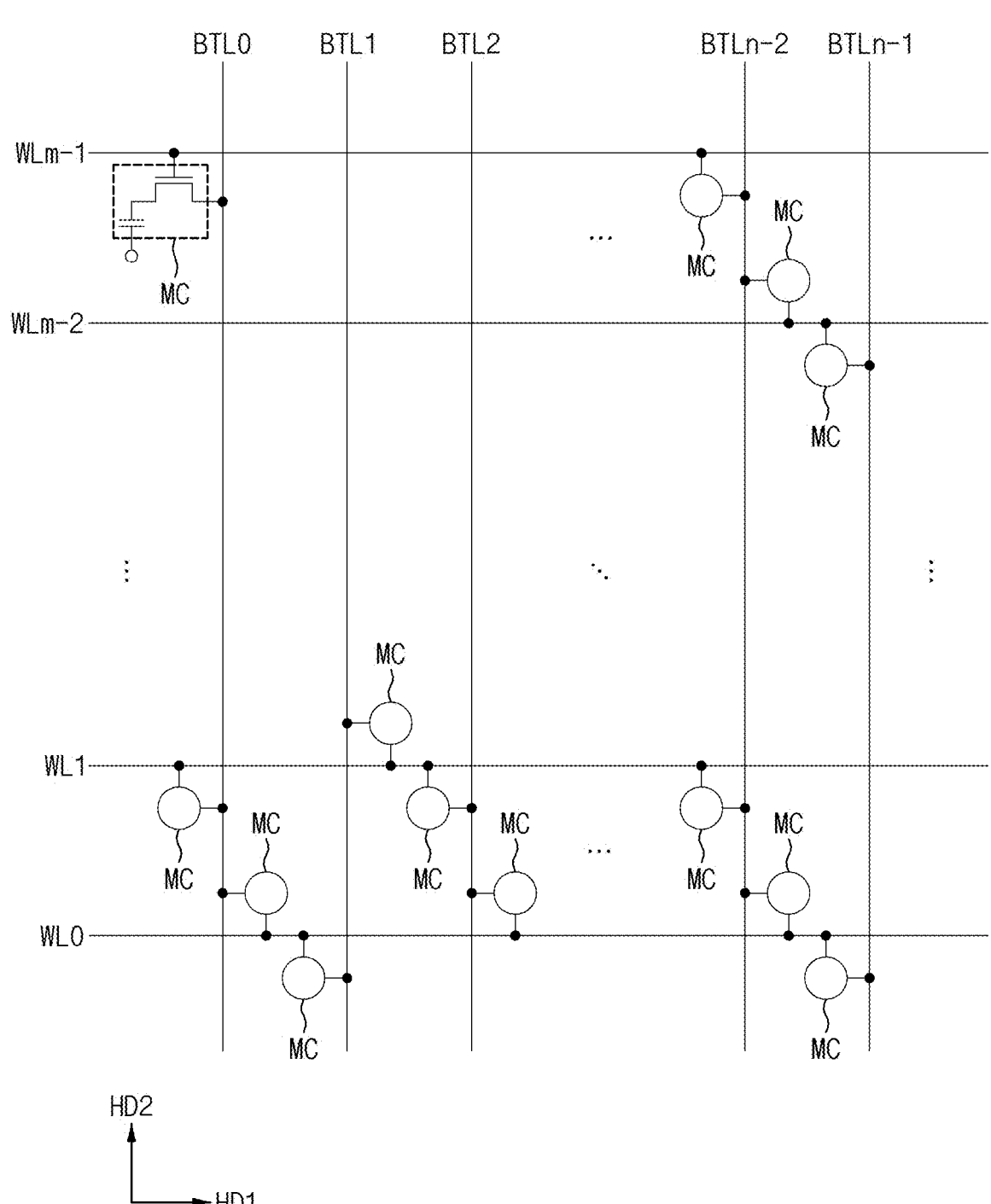
FIG. 6 illustrates an example of a first bank array in the volatile memory device of FIG. 5 according to some implementations.

FIG. 6 illustrates an example of a first bank array in the volatile memory device of FIG. 5 according to some implementations. In FIGS. 5 and 6, the first bank array 610a may include a plurality of word-lines WL-WLm−1 (where m is an even number equal to or greater than two), a plurality of bit-lines BTL0-BTLn−1 (where n is an even number equal to or greater than two), and a plurality of memory cells MCs disposed at intersections between the word-lines WL0-WLm−1 and the bit-lines BTL0-BTLn−1.

The word-lines WL-WLm−1 may extend in a first direction (i.e., a first horizontal direction) HD1 and the bit-lines BTL0-BTLn−1 may extend in a second direction (i.e., a second horizontal direction) HD2.

Each of the memory cells MCs includes an access (cell) transistor coupled to one of the word-lines WL0-WLm−1 and one of the bit-lines BTL0-BTLn–1 and a storage (cell) capacitor coupled to the cell transistor. That is, each of the memory cells MCs has a DRAM cell structure.

In addition, the memory cells MCs may have different arrangement depending on that the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line.

Figure 7:
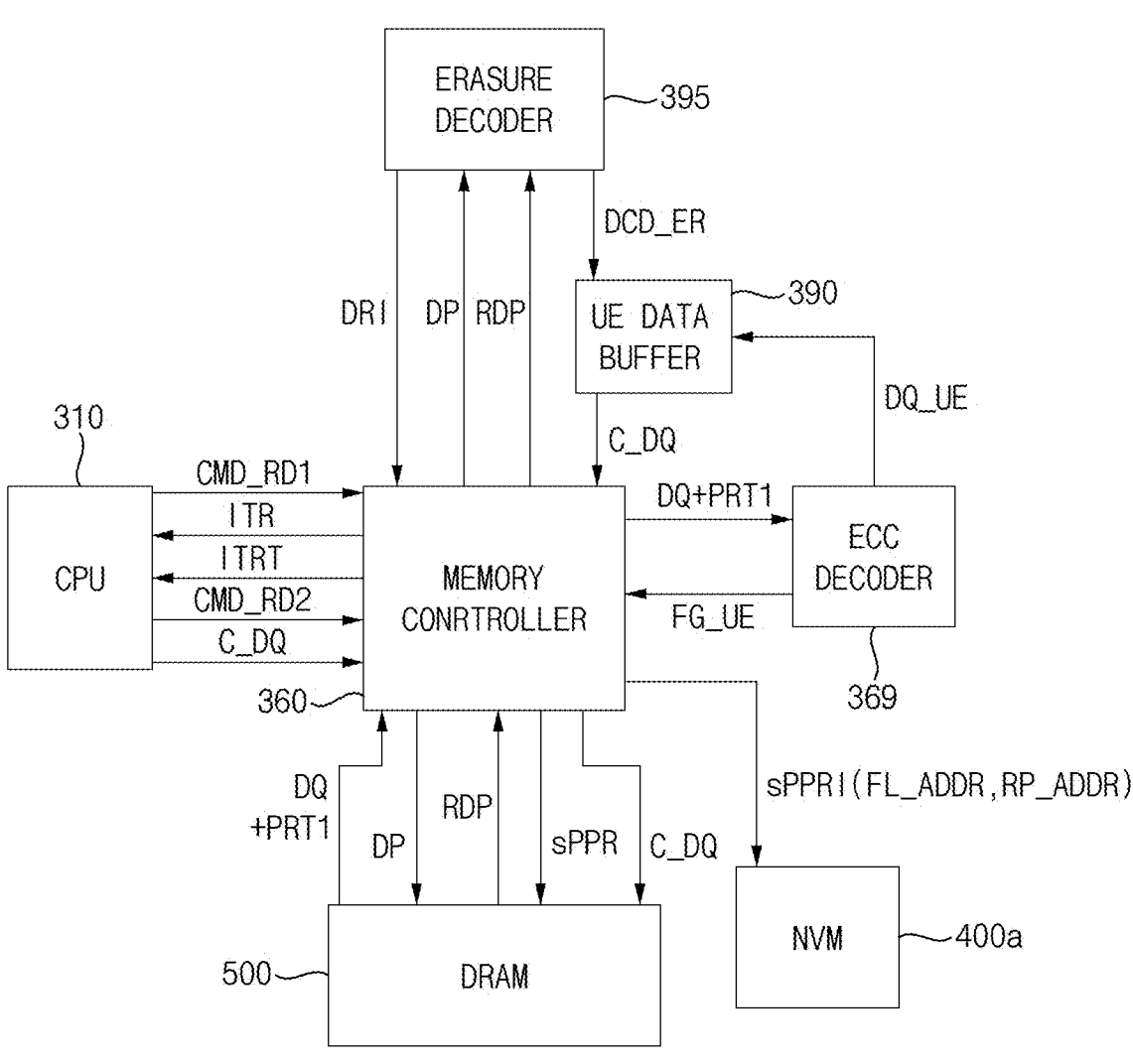
FIG. 7 is a diagram of an example of a volatile memory device and one of the nonvolatile memory devices in FIG. 1 and a portion of the storage controller of FIG. 3 according to some implementations.

FIG. 7 is a diagram of an example of a volatile memory device and one of the nonvolatile memory devices in FIG. 1 and a portion of the storage controller of FIG. 3 according to some implementations. In FIG. 7, the CPU 310, the memory controller 360, the ECC engine 365, the UE data buffer 390 and the erasure decoder 395 of the storage controller 300, the volatile memory device 500 and the nonvolatile memory device 400a are illustrated. The CPU 310 may apply a first read command CMD_RD1 designating a read operation to the memory controller 360. In response to the first read command CMD_RD1, the memory controller 360 may read the data DQ and first parity bits PRT1 and may provide the read data DQ and the first parity bits PRT1 to the ECC decoder 369.

The ECC decoder 369 may correct error bits of the read data DQ by unit of a symbol by performing an ECC decoding on the read data DQ based on the first parity bits PRT1, may provide the memory controller 360 with an error flag signal FG_UE that is activated when uncorrectable errors, which may not be corrected by the ECC decoding, are detected in the read data DQ, and may store read data DQ_UE in which the uncorrectable errors are detected in the UE data buffer 390.

In some implementations, when the error flag signal FG_UE is activated, the memory controller 360 may store the read data DQ_UE in which the uncorrectable errors in the UE data buffer 390 and may apply an interrupt signal ITR to the CPU 310. In response to the interrupt signal ITR, the CPU 310 may enter the memory controller 360 and the erasure decoder 395 into a recovery process.

In the recovery process, the memory controller 360 may write a data pattern DP in the first memory region in which the uncorrectable errors are detected, may read the data pattern DP ad a read data pattern RDP from the first memory region and may provide the written data pattern DP and the read data pattern RDP to the erasure decoder 395.

The erasure decoder 395 may perform an erasure decoding DCD_ER by determining at least one erasure location in the read data in which the uncorrectable errors are detected based on the written data pattern DP and the read data pattern RDP and generating a corrected data by correcting error bits in a target symbol corresponding to the at least one erasure location, may provide a result DRI of the erasure decoding to the memory controller 360 and may control the UE data buffer 390 to provide a corrected data C_DQ to the memory controller 360. The erasure decoder 395 may estimate an error magnitude based on error positions in at least one target symbol corresponding to the at least one erasure location and may correct the uncorrectable errors of the target symbol based on the estimated error magnitude.

The memory controller 360 may replace a defective word-line of the first memory region with a redundancy word-line of the second memory region by performing a soft PPR sPPR on the first memory region based on the result DRI of the erasure decoding, may copy data stored in the first memory region to the second memory region, may write the corrected data C_DQ in the second memory region and may apply an interrupt termination signal ITRT indicating that the recovery process is completed to the CPU 310.

In response to the interrupt termination signal ITRT, the CPU may apply a second read command CMD_RD2 designating a read operation to the memory controller 360. In response to the second read command CMD_RD2, the memory controller 360 may re-read the corrected data C_DQ stored in the second memory region of the volatile memory device 500 and may provide the corrected data C_DQ to the CPU 310.

In some implementations, the memory controller 360 may store the information sPPRI on the soft PPR in the nonvolatile memory device 400a. The information sPPRI on the soft PPR may include information on the defective address FL_ADDR of the first memory region and the replacement address RP_ADDR of the second memory region.

Figure 8:
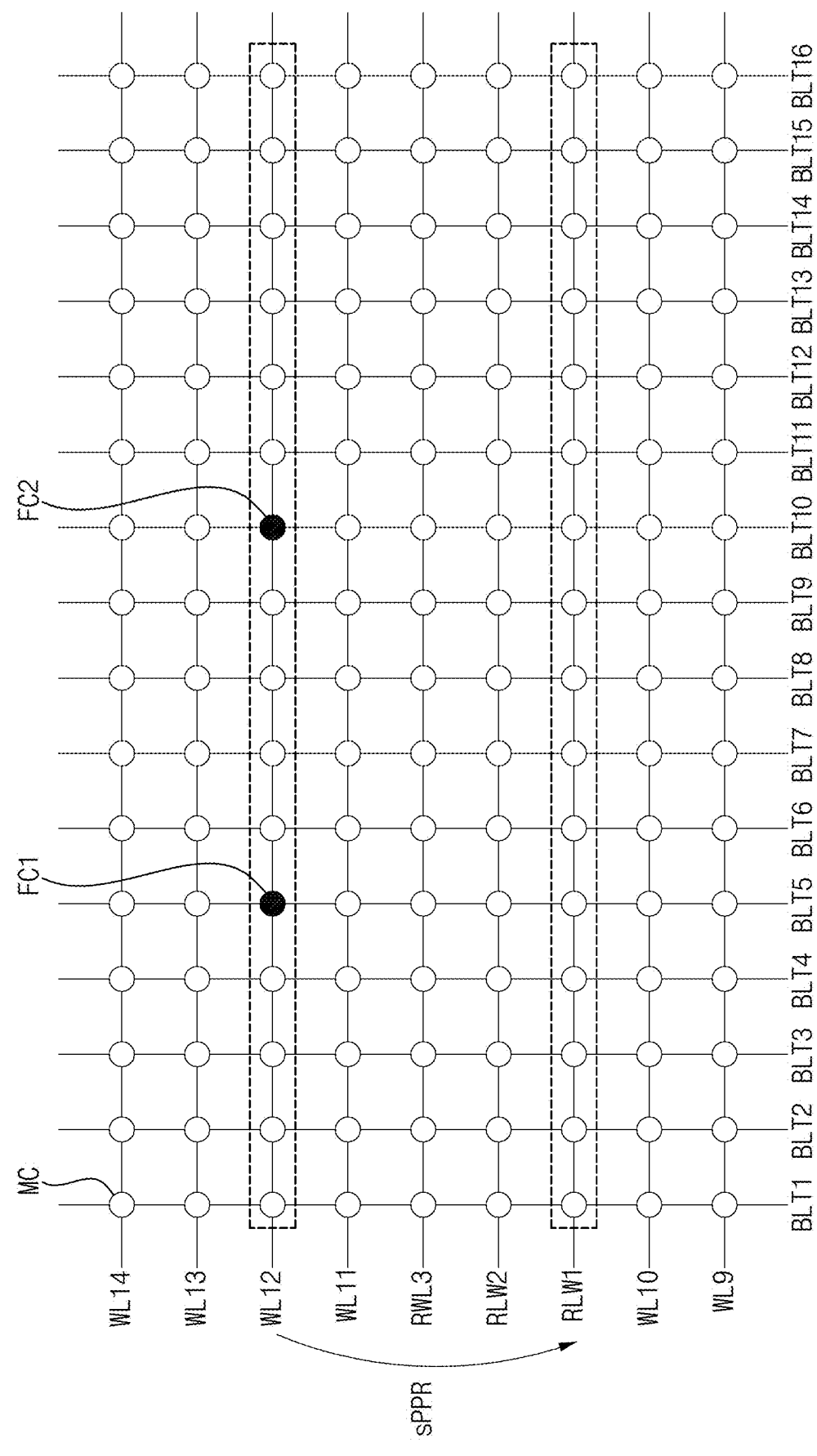
FIG. 8 is a diagram illustrating an example of a repair operation of the volatile memory device according to some implementations.

FIG. 8 is a diagram illustrating an example of a repair operation of the volatile memory device according to some implementations. In FIG. 8, assuming that memory cells MC are connected to word-lines WL9, WL10, WL11, WL12 and WL13, redundancy word-lines RWL1, RWL2 and RWL3 and bit-lines BTL1, BTL2, BTL3, BTL4, BTL5, BTL6, BTL7, BTL8, BTL9, BTL10, BTL11, BTL12, BTL13, BTL14, BTL15 and BTL16 and memory cells MC coupled to the word-line WL12 and the bit-lines BTL4 and BTL10 become defective cells FC1 and FC2 by the ECC decoding.

The memory controller 360 may transmit an soft PPR command for the word-line WL12 to the volatile memory device 500 depending on (e.g., in response to detecting) a presence of the defective cells FC1 and FC2. The volatile memory device 500 may perform a soft PPR sPPR to replace the word-line WL12 with a redundancy word-line RWL1 in response to the soft PPR command.

A DRAM such as the volatile memory device 500 may include several billion or more cells. For a normal operation, all the cells may need to normally operate. The DRAM may include spare redundancy cells therein as provision for defects generated in manufacturing and test processes. By replacing a row or a column including a defective cell with a row or column including a redundancy cell, the defective cell may be saved/repaired. Generally, a DRAM may be manufactured such that all the defects generated in a production process including manufacturing and test processes may be repaired and all the cells may normally operate.

A stress test considering deteriorations, and the like, which may occur while a DRAM is used may include a process of generating a defect which may likely occur to an actual user of a DRAM in advance and repairing the defect. Such a stress test, however, may not be able to prevent all the defects occurring in actual use of a DRAM in advance. Recently, as a solution for defects occurring in a user stage, a relevant circuit has been included in a DRAM such that a user may directly perform a repair operation through a PPR operation.

The PPR operation of the DRAM may be divided into a hard PPR and a soft PPR. The hard PPR may perform a repair operation by changing physical fuse information in both the manufacturing stage and the testing stage. In this case, all fuse information including respective fuse information may be loaded in a redundancy processing circuit of an address decoder again. In this case, all data currently in tasking may be lost, and a great amount of time may be consumed until the data is in a usable state. For this reason, even when a failed cell occurs in a situation in which a DRAM needs to be continuously used, the hard PPR may not be performed instantly.

The above-described issue may be addressed using the soft PPR. The soft PPR may be a random repair method, rather than the changing of physical fuse information, and when power is turned off, respective repair information may disappear. However, the soft PPR may be repaired for a relatively short period of time, and data of addresses other than the repaired address may be used as is without being lost. For this reason, when a failed cell occurs in a situation in which a DRAM needs to be continuously used, by replacing the respective defective address with a redundancy address (i.e., a replacement address) through the soft PPR, the DRAM may be continuously used without interruption.

In the storage device 200, according to some implementations, when the uncorrectable errors are detected in the read data read from the volatile memory device 500, the storage controller 300 may perform the soft PPR to replace the first memory region in which the data including the uncorrectable errors, with the second memory region during a run-time of the storage device 200.

Figure 9:
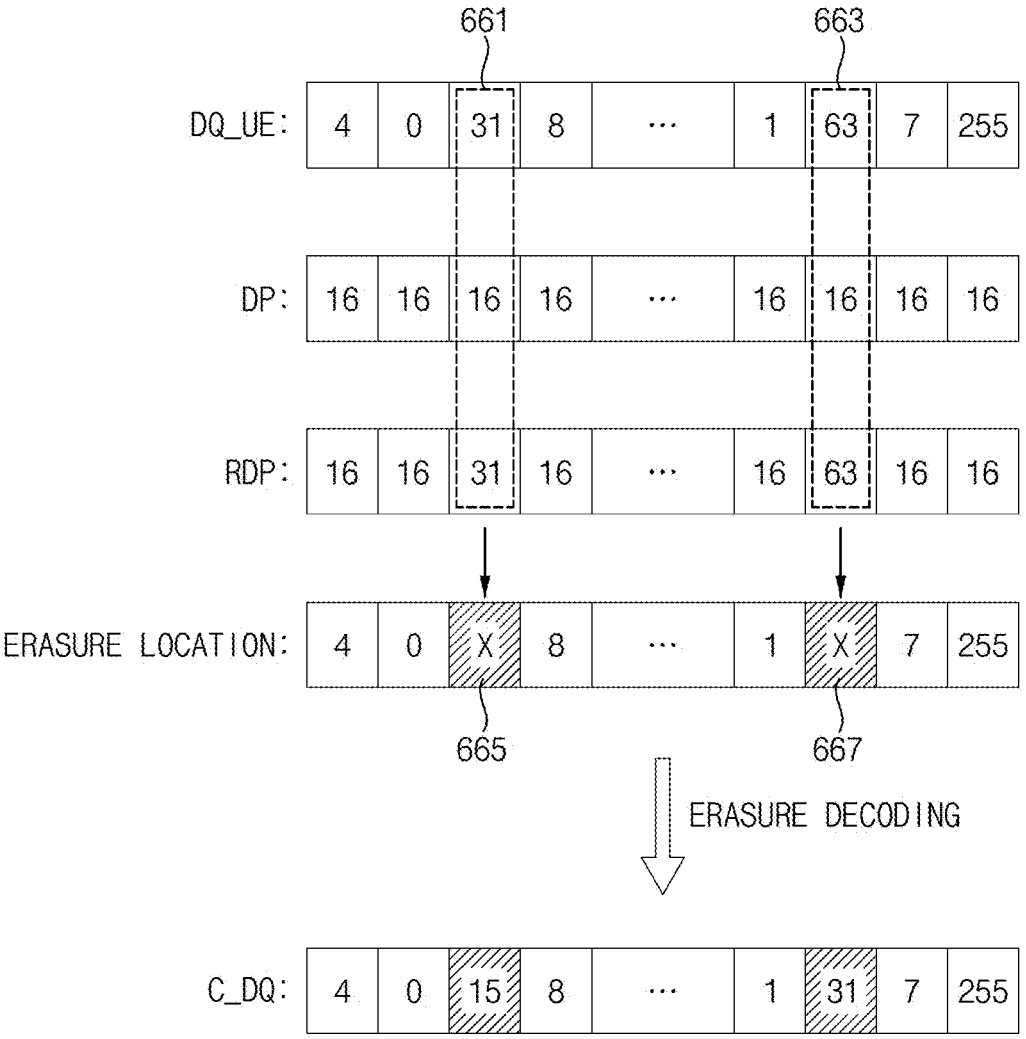
FIG. 9 is a diagram of an example of an erasure decoding of the erasure decoder according to some implementations.

FIG. 9 is a diagram of an example of an erasure decoding of the erasure decoder according to some implementations. In FIGS. 6 and 9, the memory controller 360 may write a known data pattern DP in symbol units to the first memory region in which the uncorrectable errors, of the volatile memory device 500 are detected, may read data pattern DP in symbol units as the read data pattern RDP from the first memory region and may provide the written data pattern DP and the read data pattern RDP to the erasure decoder 395. The erasure decoder 395 may perform the erasure decoding by determining erasure locations 665 and 667 in the data DQ_UE in which the uncorrectable errors occurred by comparing the written data pattern DP and the read data pattern RDP, estimating the error magnitude based on the error positions in the symbols corresponding to the erasure locations 665 and 667, and generating the corrected data C_DQ by correcting error bits based on the estimated error magnitude.

In FIG. 9, assuming that each symbol includes one byte, each symbol includes 8 memory cells, and one symbol may store data corresponding to a value from 0 to 255. That is, the memory controller 360 may read data 4, 0, 31, 8, . . . , 1, 63, 7, 255 from each of the eight memory cells in symbol units of the data DQ_UE in which the uncorrectable errors occurred, may write data pattern DP of 16, 16, 16, 16, . . . , 16, 16, 16, 16, in symbol units, to the first memory region in which the data DQ_UE in which the uncorrectable errors occurred is stored, and may read data pattern RDP of 16, 16, 31, 16, . . . , 16, 63, 16, 16, in symbol units, from the first memory region as reference numerals 661 and 663 indicate.

The erasure decoder 395 may determine the erasure locations 665 and 667 based on comparison of the data pattern DP and the read data pattern RDP, may estimate the error magnitude based on the error positions in the symbols corresponding to the erasure locations 665 and 667, and may generate the corrected data by correcting error bits based on the estimated error magnitude. Accordingly, it may be noted that the data of the symbol corresponding to the erasure location 665 is corrected from 31 to 15, and the data of the symbol corresponding to the erasure location 667 is corrected from 63 to 31.

The memory controller 360 may replace a detect word-line of a first memory region in which the data DQ_UE is stored to a redundancy word-line of a second memory region, may copy the data corresponding to the data DQ_UE of the first memory region to the second memory region and may write corrected data (for example, 15 and 31) to the second memory region.

Figure 10:
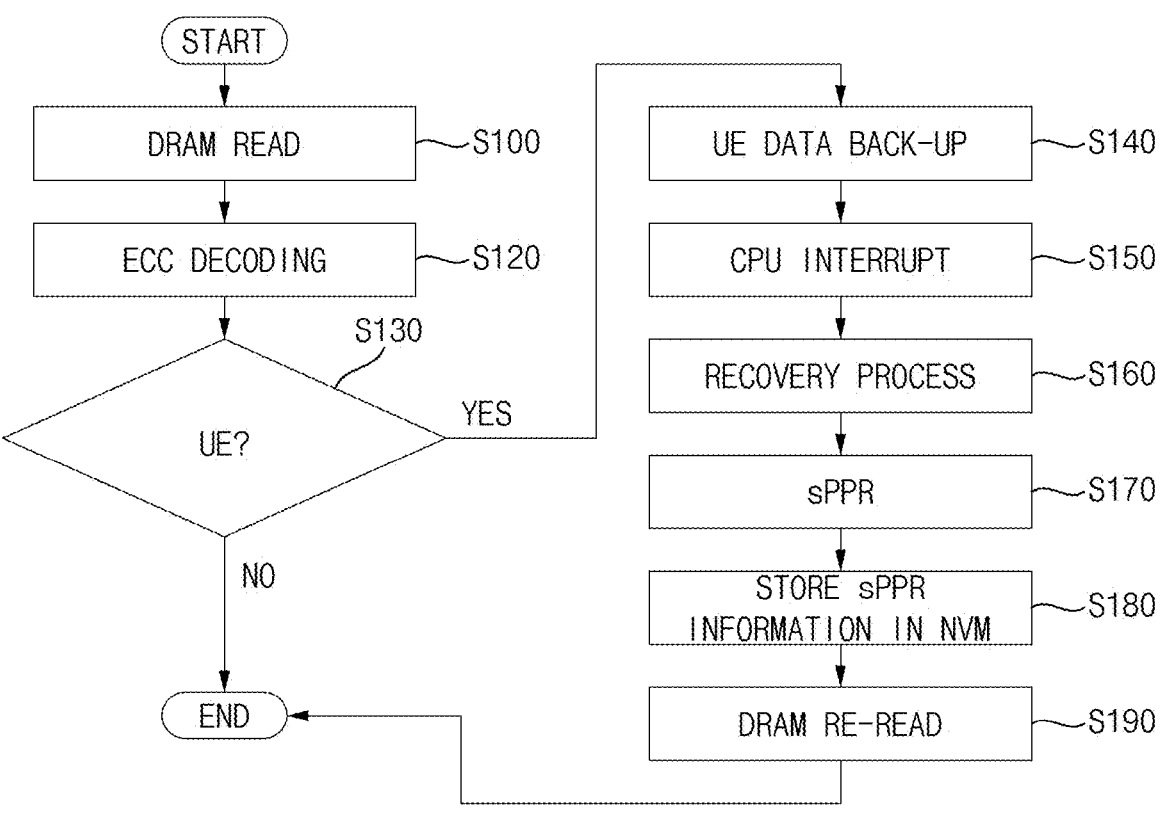
FIG. 10 is a flow chart illustrating an example of method of operating a storage device according to some implementations.

FIG. 10 is a flow chart illustrating an example of a method of operating a storage device according to some implementations. In FIGS. 3 through 10, the memory controller 360 may read data from the volatile memory device 500 and may provide the read data to the ECC decoder 369 under control of the CPU 310 in operation S100.

The ECC decoder 369 may performs an ECC decoding on the read data in operation S120, and may determine that uncorrectable error UE is detected in the read data in operation S130. The ECC decoding may be Reed-Solomon decoding, which corrects errors by unit of a symbol.

When the uncorrectable error UE is not detected in the read data (NO in S130), the memory controller 360 provides the read data to the CPU 310 and the operation ends.

When the uncorrectable error UE is detected in the read data (YES in S130), the ECC decoder 369 may provide the UE data buffer 390 with the data DQ_UE in which the uncorrectable error UE is detected (i.e., the uncorrectable error UE occurred) in operation S140, the memory controller 360 may apply the interrupt signal to the CPU 310 in operation S150. In response to the interrupt signal, the CPU 310 may enter the memory controller 360 and the erasure decoder 395 into a recovery process in operation S160 to correct the uncorrectable error and to provide information sPPRI of the soft PPR to the volatile memory device 500.

The volatile memory device 500 may perform a soft PPR sPPR to replace the defective word-line of the first memory region with a redundancy word-line of the second memory region in operation S170. The memory controller may store the information sPPRI of the soft PPR in the nonvolatile memory device 400a in operation S180.

The memory controller 360 may perform a re-read operation on the second memory region under control of the CPU 310 in operation S190, may read the corrected data C_DQ form the second memory region and may provide the corrected data C_DQ to the CPU 310.

Figure 11:
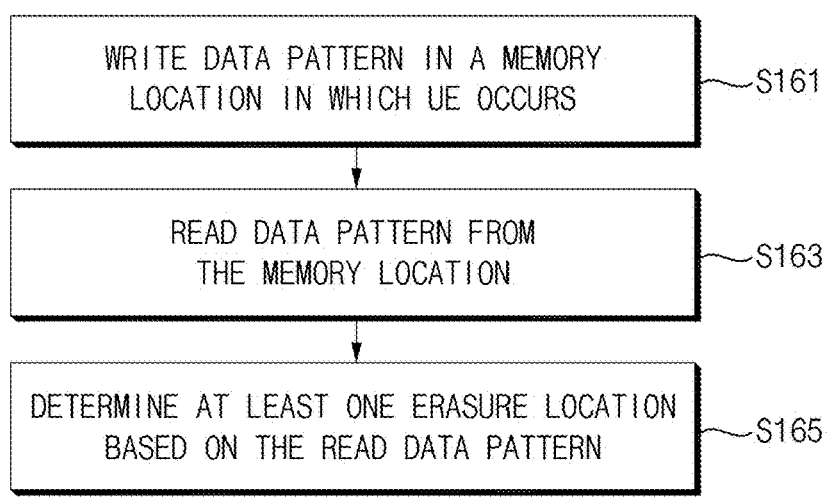
FIG. 11 is a flow chart illustrating an example of a method of a recovery process in a method of operating a storage device of FIG. 10 according to some implementations.

FIG. 11 is a flow chart illustrating an example of a method of a recovery process in a method of operating a storage device of FIG. 10 according to some implementations. In FIGS. 7, 9 and 11, for performing the recovery process (operation S160), the memory controller 360 may write the known data pattern DP to the first memory region in which the uncorrectable errors, of the volatile memory device 500 are detected (operation S161), may read data pattern DP as the read data pattern RDP from the first memory region (operation S163) and may provide the written data pattern DP and the read data pattern RDP to the erasure decoder 395. The erasure decoder 395 may determine erasure locations 665 and 667 in the data DQ_UE in which the uncorrectable errors occurred by comparing the written data pattern DP and the read data pattern RDP (operation S165), may estimate the error magnitude based on the error positions in the symbols corresponding to the erasure locations 665 and 667, and may generate the corrected data C_DQ by correcting error bits based on the estimated error magnitude.

Figure 12:
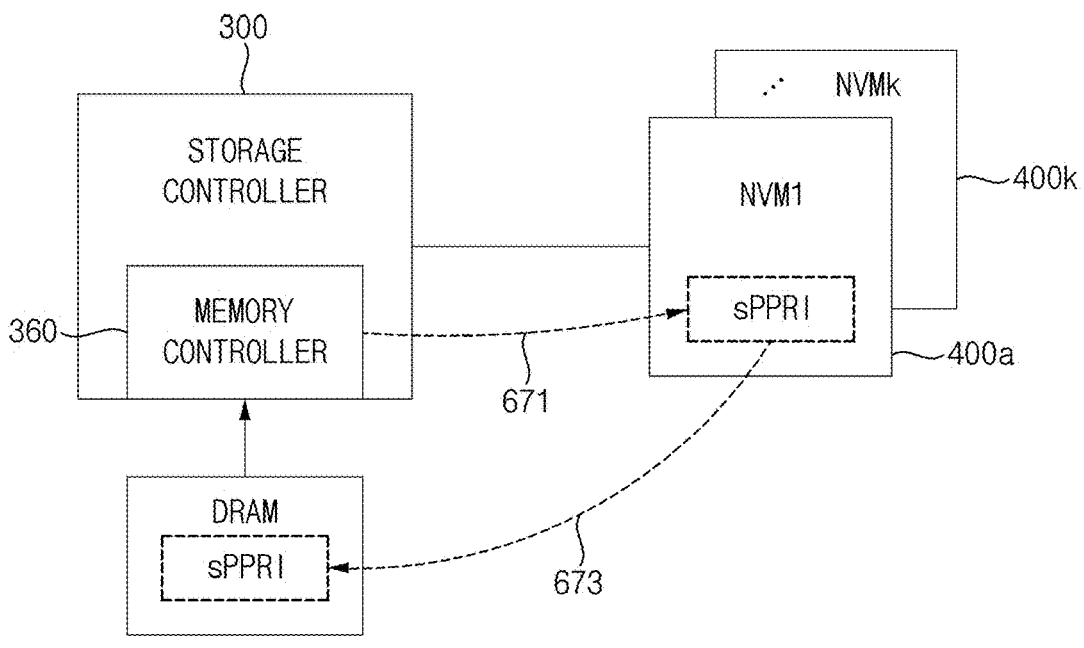
FIG. 12 is a diagram that illustrates an example of a storage device configured to store information of the soft PPR according to some implementations.

FIG. 12 is a diagram that illustrates an example of a storage device configured to store information of the soft PPR according to some implementations. In FIG. 12, the memory controller 360 in the storage controller 300 may store the information sPPRI of the soft PPR in a memory block of the nonvolatile memory device 400a as a reference numeral 671 indicates after the soft PPR is completed. The nonvolatile memory device 400a may load the information sPPRI of the soft PPR into the volatile memory device 500 as a reference numeral 673 indicates after a power of the storage device 200 is reset and volatile memory device 500 may perform a soft PPR on the first memory region based on the information sPPRI of the soft PPR.

Figure 13:
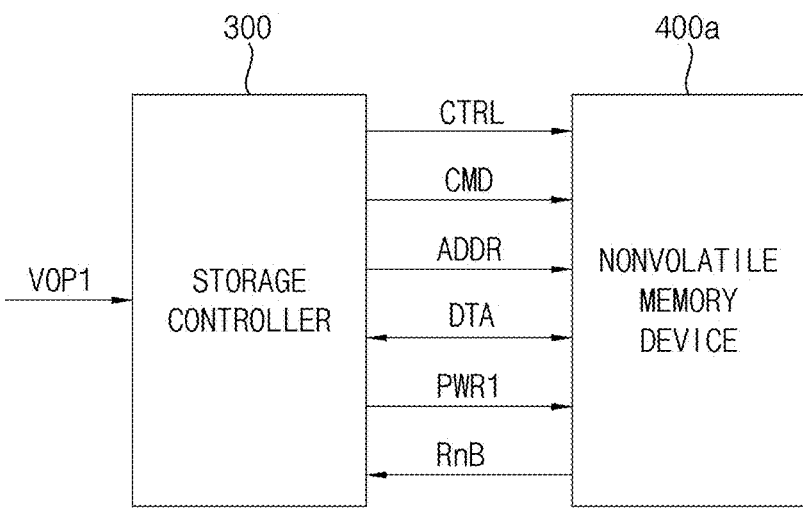
FIG. 13 is a block diagram illustrating an example of a connection relationship between the storage controller and one nonvolatile memory device in the storage device of FIG. 1 according to some implementations.

FIG. 13 is a block diagram illustrating an example of a connection relationship between the storage controller and one nonvolatile memory device in the storage device of FIG. 1 according to some implementations. In FIG. 13, the storage controller 300 may operate based on the first operating voltage VOP1.

The nonvolatile memory device 400a may perform an erase operation, a program operation, and/or a write operation under control of the storage controller 300. The nonvolatile memory device 400a may receive a command CMD, an address ADDR, and (user) data DTA through input/output lines from the storage controller 300 for performing such operations. In addition, the nonvolatile memory device 400a may receive a control signal CTRL through a control line and may receive a power PWR1 through a power line from the storage controller 300. In addition, the nonvolatile memory device 400a may provide a status signal RnB to the storage controller 300 through the control line. In addition, the nonvolatile memory device 400a may provide the storage controller 300 with the data DTA.

Figure 14:
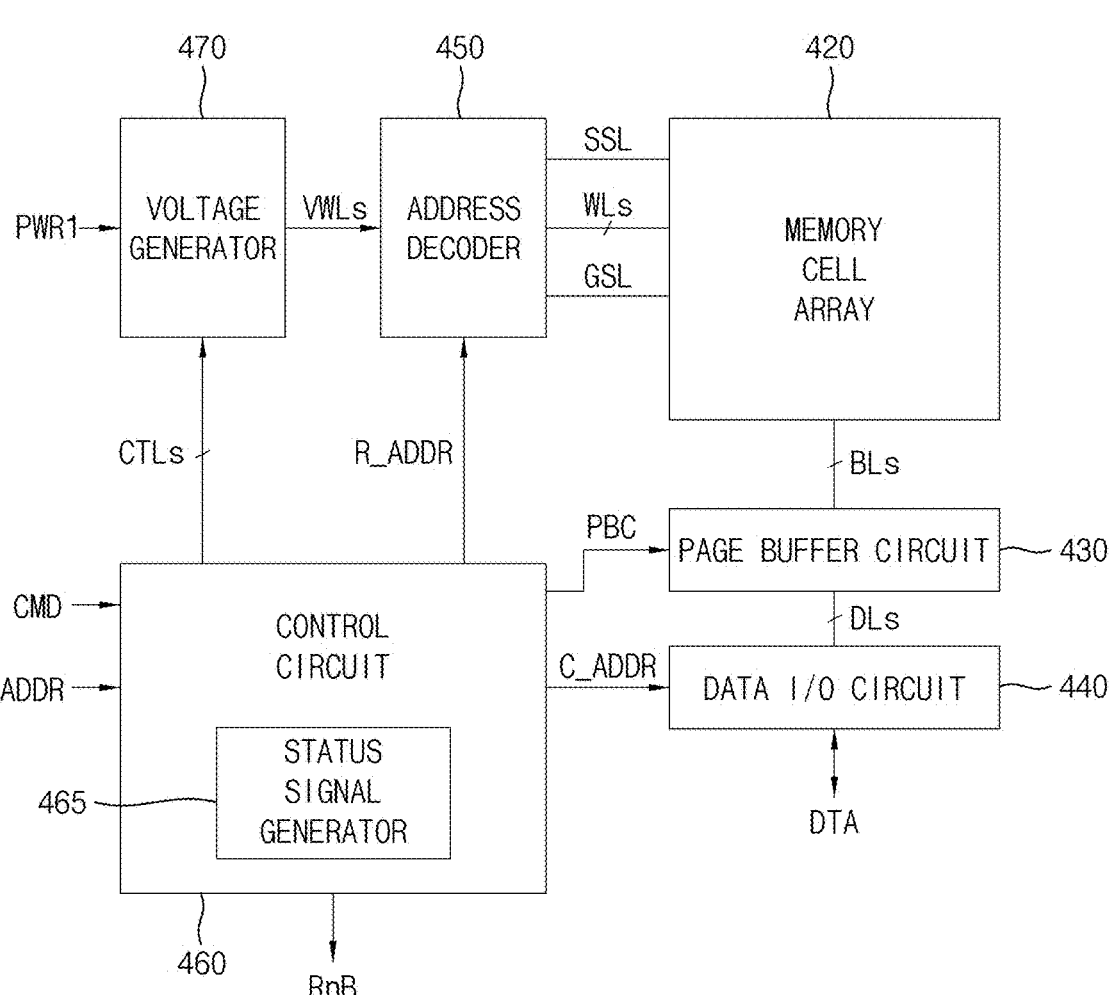
FIG. 14 is a block diagram illustrating an example of the nonvolatile memory device in FIG. 13 according to some implementations.

FIG. 14 is a block diagram illustrating an example of the nonvolatile memory device in FIG. 13 according to some implementations. In FIG. 14, the nonvolatile memory device 400a may include a memory cell array 420, an address decoder 450, a page buffer circuit 430, a data input/output (I/O) circuit 440, a control circuit 460, and a voltage generator 470.

The memory cell array 420 may be coupled to the address decoder 450 through a string selection line SSL, a plurality of word-lines WLs, and a ground selection line GSL. In addition, the memory cell array 420 may be coupled to the page buffer circuit 430 through a plurality of bit-lines BLs.

The memory cell array 420 may include a plurality of memory cells coupled to the plurality of word-lines WLs and the plurality of bit-lines BLs.

In some implementations, the memory cell array 420 may be or include a three-dimensional memory cell array, which is formed on a substrate in a three-dimensional structure (e.g., a vertical structure). In this case, the memory cell array 420 may include (vertical) cell strings that are vertically oriented such that at least one memory cell is located over another memory cell.

Figure 15:
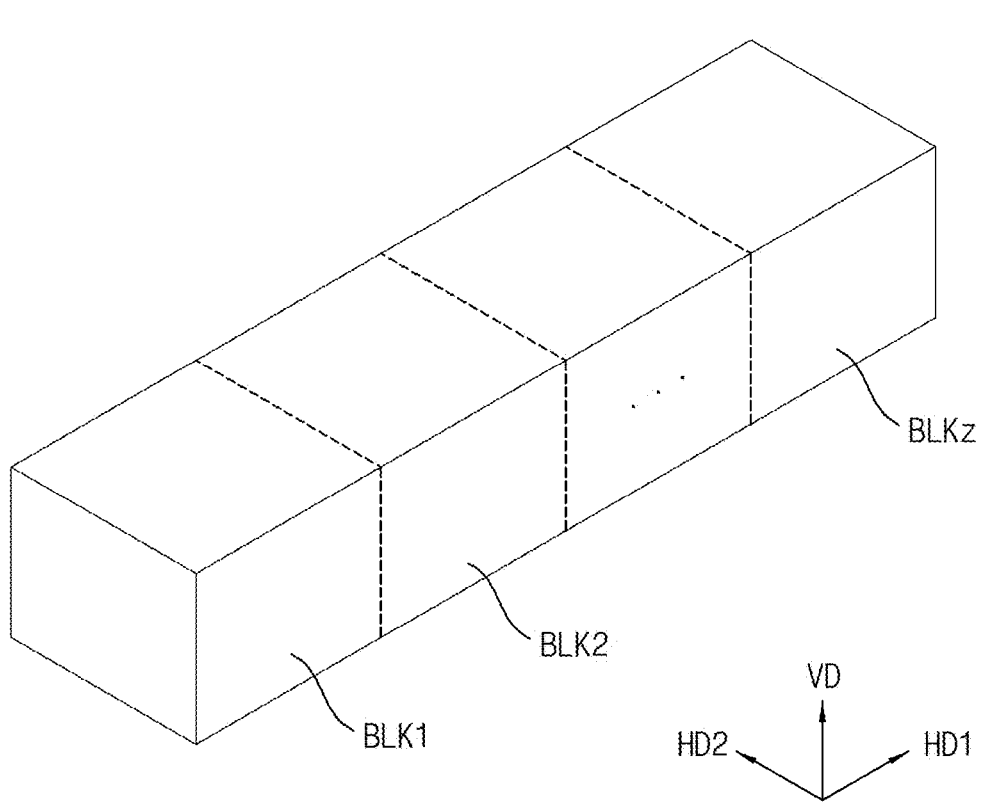
FIG. 15 is a block diagram illustrating an example of the memory cell array in the nonvolatile memory device of FIG. 14 according to some implementations.

FIG. 15 is a block diagram illustrating an example of the memory cell array in the nonvolatile memory device of FIG. 14 according to some implementations. In FIG. 15, the memory cell array 420 may include a plurality of memory blocks BLK1, BLK2 to BLKz. The memory blocks BLK1, BLK2 to BLKz extend along a first horizontal direction HD1, a second horizontal direction HD2 and a vertical direction VD. Here, z is a natural number greater than two. In some implementations, the memory blocks BLK1, BLK2 to BLKz are selected by the address decoder 450 in FIG. 14. For example, the address decoder 450 may select a memory block BLK corresponding to a block address among the memory blocks BLK1, BLK2 to BLKz.

Figure 16:
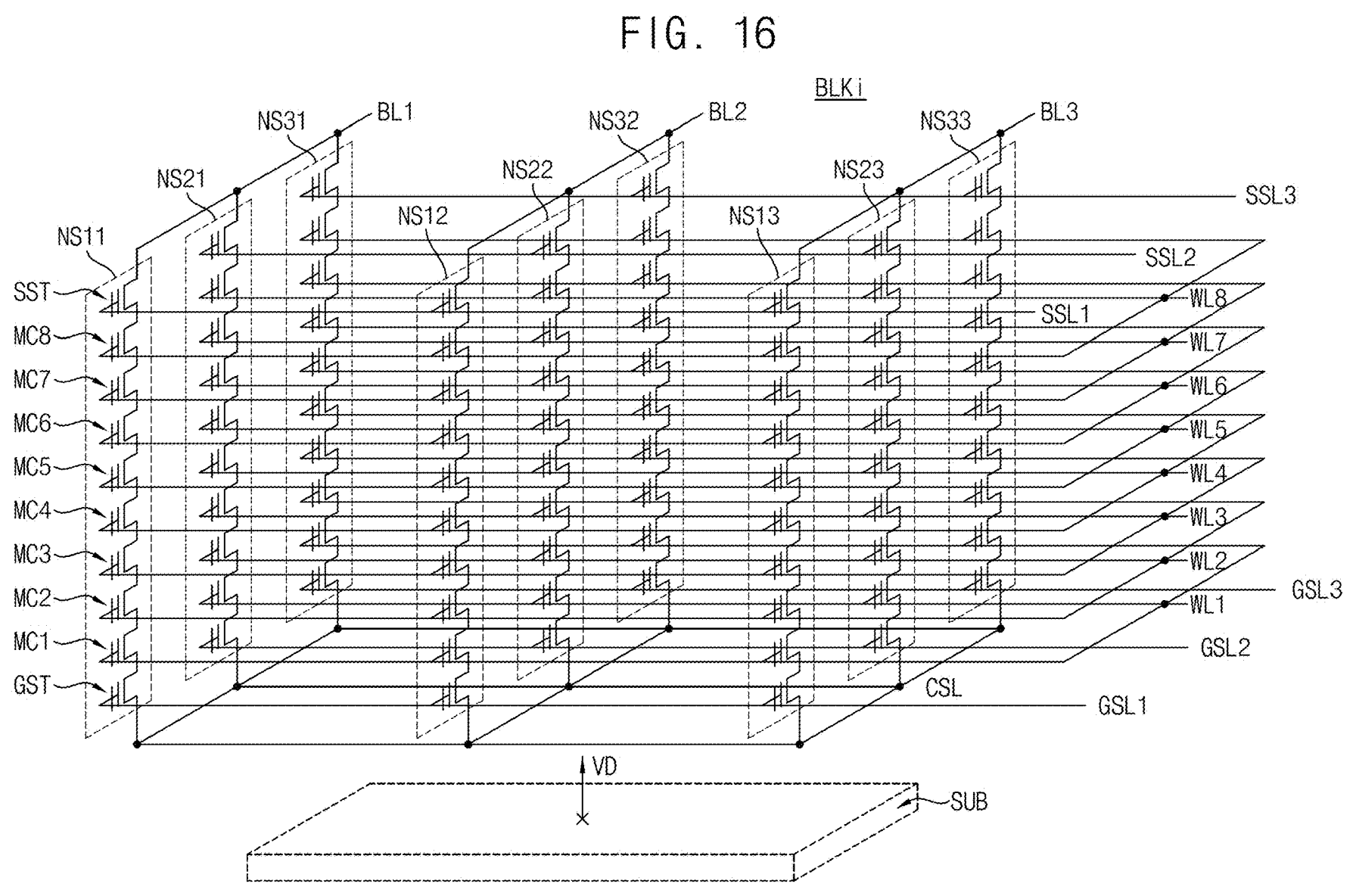

FIG. 16 is a circuit diagram illustrating one of the memory blocks of FIG. 15 according to some implementations. The memory block BLKi of FIG. 16 may be formed on a substrate SUB in a three-dimensional structure (or a vertical structure). For example, a plurality of memory cell strings included in the memory block BLKi may be formed in a vertical direction VD perpendicular to the substrate SUB.

In FIG. 16, the memory block BLKi may include a plurality of cell strings NS11, NS21, NS31, NS12, NS22, NS32, NS13, NS23 and NS33 (herein, represented as NS11 to NS33) coupled between bit-lines BL1, BL2 and BL3 and a common source line CSL. Each of the memory cell strings NS11 to NS33 may include a string selection transistor SST, a plurality of memory cells MC1, MC2, MC3, MC4, MC5, MC6, MC7 and MC8 (herein, represented as MC1 to MC8), and a ground selection transistor GST. In FIG. 16, each of the memory cell strings NS11 to NS33 is illustrated to include eight memory cells MC1 to MC8. However, present disclosures are not limited thereto. In some implementations, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 16, the memory block BLKi is shown to be coupled to eight word-lines WL1 to WL8 and three bit-lines BL1 to BL3. However, present disclosures are not limited thereto. In some implementations, the memory cell array 420 may be coupled to any number of word-lines and bit-lines.

Figure 17:
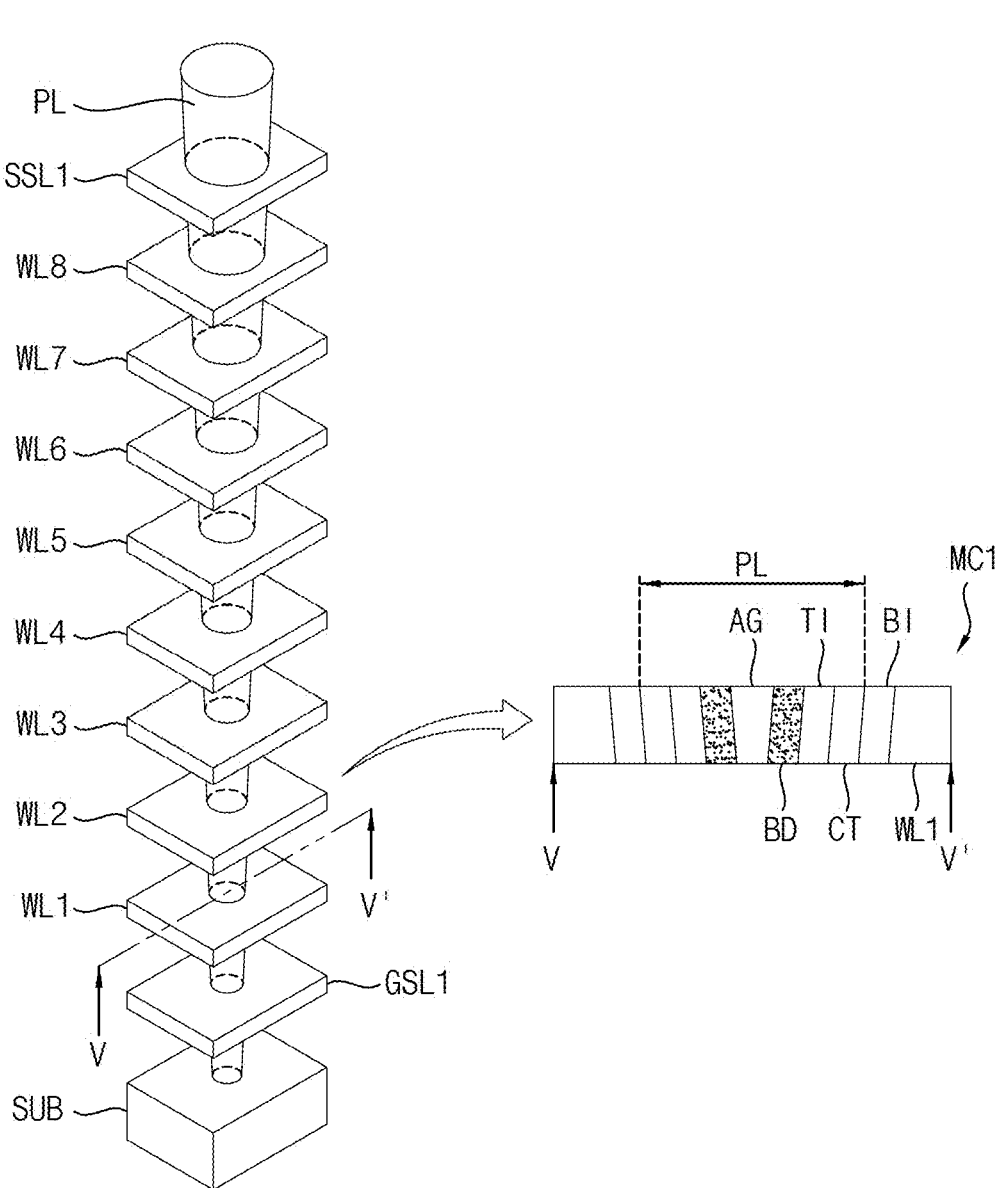
FIG. 17 illustrates an example of a structure of a cell string NS11 in the memory block of FIG. 16 according to some implementations.

FIG. 17 illustrates an example of a structure of a cell string NS11 in the memory block of FIG. 16 according to some implementations. In FIGS. 16 and 17, a pillar PL is provided on the substrate SUB such that the pillar PL extends in a direction perpendicular to the substrate SUB to make contact with the substrate SUB. Each of the ground selection line GSL, the word lines WL1 to WL8, and the string selection lines SSL1 illustrated in FIG. 17 may be formed of a conductive material parallel with the substrate SUB, for example, a metallic material. The pillar PL may be in contact with the substrate SUB through the conductive materials forming the string selection lines SSL1, the word lines WL1 to WL8, and the ground selection line GSL1.

A sectional view taken along a line V-V' is shown in FIG. 17. In some implementations, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

In FIG. 14, the control circuit 460 may receive the command (signal) CMD and the address (signal) ADDR from the storage controller 300, and may control an erase loop, a program loop and/or a read operation of the non-volatile memory device 400a based on the command signal CMD and the address signal ADDR. The program loop may include a program operation and a program verification operation. The erase loop may include an erase operation and an erase verification operation.

For example, the control circuit 460 may generate control signals CTLs, which are used for controlling the voltage generator 470, may generate a page buffer control signal PBC for controlling the page buffer circuit 430 based on the command signal CMD, may provide the control signals CTLs to the voltage generator 470 and may provide the page buffer control signal PBC to the page buffer circuit 430. In addition, the control circuit 460 may generate a row address R_ADDR and a column address C_ADDR based on the address signal ADDR. The control circuit 460 may provide the row address R_ADDR to the address decoder 450 and may provide the column address C_ADDR to the data I/O circuit 440.

The address decoder 450 may be coupled to the memory cell array 420 through the string selection line SSL, the plurality of word-lines WLs, and the ground selection line GSL. During the program operation or the read operation, the address decoder 450 may determine one of the plurality of word-lines WLs as a first word-line (e.g., a selected word-line) and determine rest of the plurality of word-lines WLs except for the first word-line as unselected word-lines based on the row address R_ADDR.

The voltage generator 470 may generate word-line voltages VWLs, which are required for the operation of the nonvolatile memory device 400a, based on the control signals CTLs. The voltage generator 470 may receive the power PWR1 from the storage controller 300. The word-line voltages VWLs may be applied to the plurality of word-lines WLs through the address decoder 450.

For example, during the erase operation, the voltage generator 470 may apply an erase voltage to a well of the memory block and may apply a ground voltage to entire word-lines of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the first word-line and may apply a program pass voltage to the unselected word-lines. In addition, during the program verification operation, the voltage generator 470 may apply a program verification voltage to the first word-line and may apply a verification pass voltage to the unselected word-lines.

Furthermore, during the read operation, the voltage generator 470 may apply a read voltage to the first word-line and may apply a read pass voltage to the unselected word-lines.

The page buffer circuit 430 may be coupled to the memory cell array 420 through the plurality of bit-lines BLs. The page buffer circuit 430 may include a plurality of page buffers. In some implementations, one page buffer may be connected to one bit-line. In some implementations, one page buffer may be connected to two or more bit-lines.

The page buffer circuit 430 may temporarily store data to be programmed in a selected page or data read out from the selected page.

The data I/O circuit 440 may be coupled to the page buffer circuit 430 through data lines DLs. During the program operation, the data input/output circuit 440 may receive the data DTA from the storage controller 300 provide the data DTA to the page buffer circuit 430 based on the column address C_ADDR received from the control circuit 460.

During the read operation, the data I/O circuit 440 may provide the data DTA, which are stored in the page buffer circuit 430, to the storage controller 300 based on the column address C_ADDR received from the control circuit 460.

The control circuit 460 may control the page buffer circuit 430 and data I/O circuit 440.

The control circuit 460 may include a status signal generator 465 and the status signal generator 465 may generate the status signal RnB indicating whether each of the program operation, the erase operation and the read operation is completed or and/or is in progress.

The storage controller 300 may determine idle state or busy state of each of the nonvolatile memory devices 400a-400k based on the status signal RnB.

Figure 18:
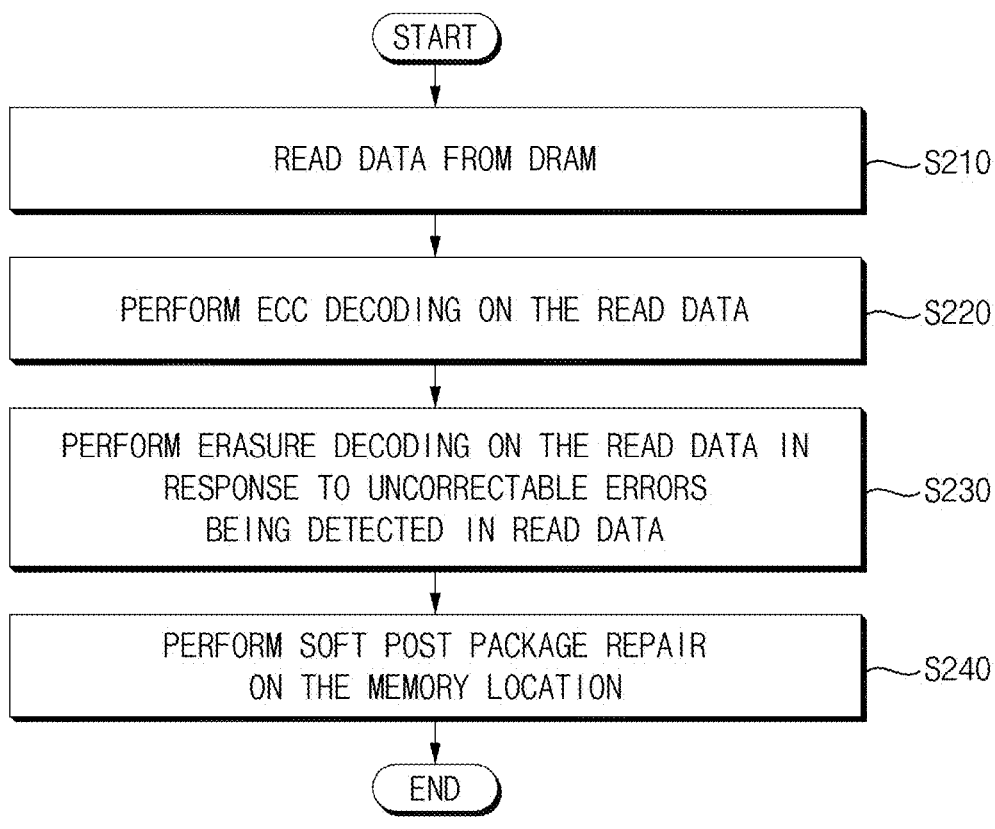
FIG. 18 is a flow chart illustrating an example of a method of operating a storage device according to some implementations.

FIG. 18 is a flow chart illustrating an example of a method of operating a storage device according to some implementations.

There is provided a description on an examples of a method of operating a storage device 200 that includes at least one nonvolatile memory device 400a, a volatile memory device 500 and a storage controller 300 to control the at least one nonvolatile memory device 400a and the volatile memory device 500 with reference to FIGS. 1, 3 through 9, and 18. According to the method, the memory controller 360 may read data from the volatile memory device 500 and may provide the read data to the ECC decoder 369 under control of the CPU 310 in operation S210.

The ECC decoder 369 may performs an ECC decoding on the read data in operation S120, and may determine that uncorrectable error UE is detected in the read data in operation S220.

When the uncorrectable error UE is detected in the read data, the ECC decoder 369 may provide the UE data buffer 390 with the data DQ_UE in which the uncorrectable error UE is detected (i.e., the uncorrectable error UE occurred) and the erasure decoder 395 may perform an erasure decoding on the data DQ_UE in which the uncorrectable error UE is detected in operation S230.

The memory controller 360 may write the known data pattern DP to the first memory region in which the uncorrectable errors, of the volatile memory device 500 are detected, may read data pattern DP as the read data pattern RDP from the first memory region and may provide the written data pattern DP and the read data pattern RDP to the erasure decoder 395. The erasure decoder 395 may perform the erasure decoding by determining erasure locations in the data DQ_UE in which the uncorrectable errors occurred by comparing the written data pattern DP and the read data pattern RDP, estimating the error magnitude based on the error positions in the symbols corresponding to the erasure locations, and generating the corrected data C_DQ by correcting error bits based on the estimated error magnitude.

After the performing the erasure decoding, the erasure decoder 395 may provide a result DRI of the erasure decoding to the memory controller 360 and the memory controller 360 may provide the information sPPRI on the soft PPR to the volatile memory device 500.

The volatile memory device 500 may perform a soft PPR sPPR to replace the defective word-line of the first memory region with a redundancy word-line of the second memory region in operation based on the information sPPRI on the soft PPR in operation S240.

In the storage device and the method of operating the storage device, when uncorrectable errors, which cannot be corrected by an ECC decoding, are detected in the read data from the volatile memory device, the storage controller may correct the uncorrectable errors by performing an erasure decoding on the read data, may perform a soft PPR on the volatile memory device based on a result of the erasure decoding, may store a corrected data in a redundancy region, may re-read data stored in the redundancy region and may provide the re-read data to the CPU. Accordingly, even if errors that cannot be corrected by ECC are detected in the data read from the volatile memory device, recovery is possible during a run-time of the storage device, thereby preventing malfunction of the storage device due to defects in the volatile memory device. Therefore, performance and lifespan of the storage device may be improved.

Figure 19:
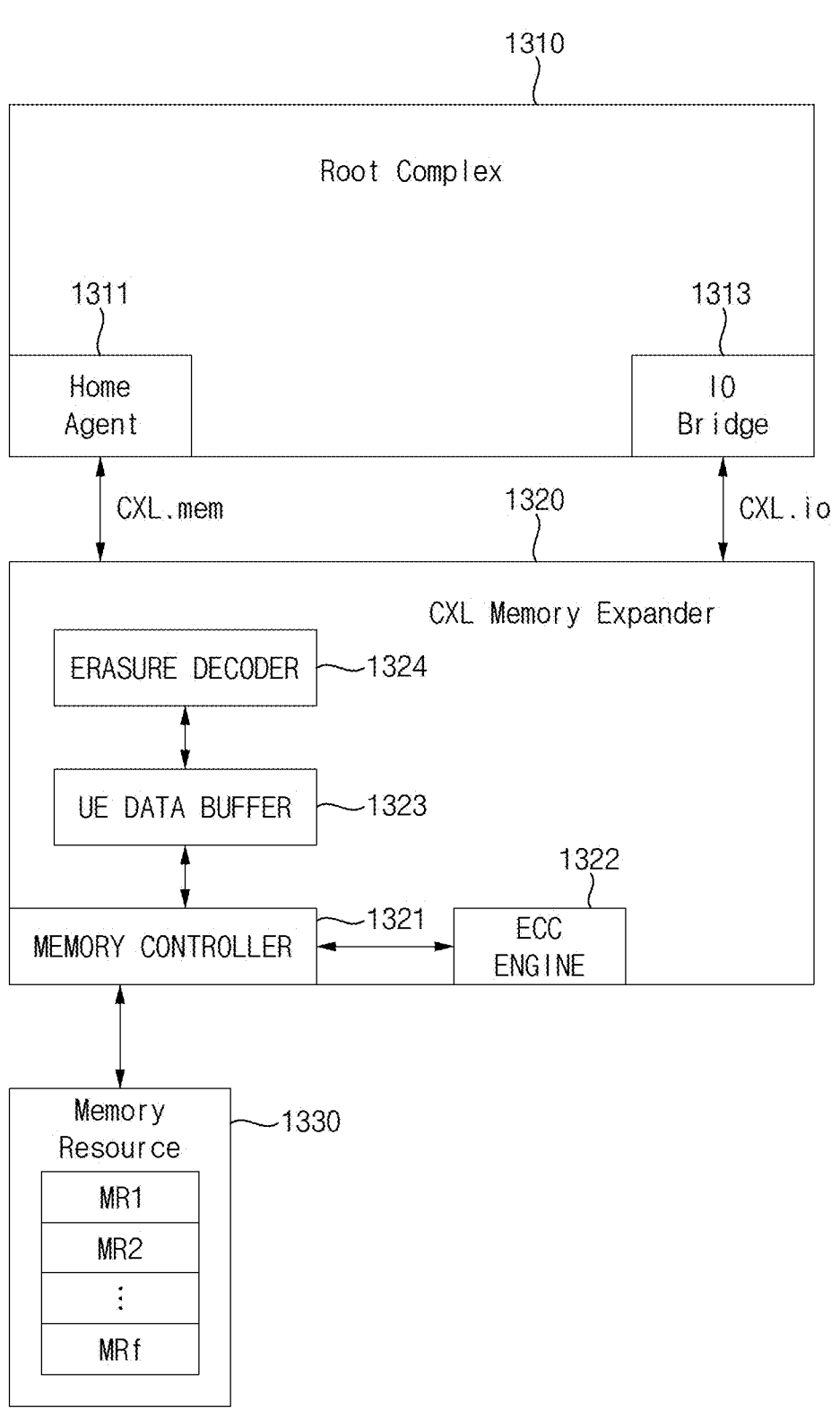
FIG. 19 is an example of a computing system when a memory system corresponds to a Type 3 memory system defined by a compute express link (CXL) protocol according to some implementations.

FIG. 19 is an example of a computing system when a memory system corresponds to a Type 3 memory system defined by a compute express link (CXL) protocol according to some implementations. In FIG. 19, a computing system 1300 may include a root complex 1310, a CXL memory expander 1320 connected to the root complex 1310 and a memory resource 1330.

The root complex 1310 may include a home agent 1311 and an I/O bridge 1313, and the home agent 1311 may communicate with the CXL memory expander 1320 based on a coherent protocol CXL.mem the I/O bridge 1313 may communicate with the CXL memory expander 1320 based on a non-coherent protocol, i.e., an I/O protocol CXL.io. In a CXL protocol base, the home agent 1311 may correspond to an agent on a host side that is arranged to solve the entire consistency of the computing system 1300 for a given address.

The CXL memory expander 1320 may include a memory controller 1321, an ECC engine 1322, an UE data buffer 1323 and an erasure decoder 1324.

In addition, the CXL memory expander 1320 may output data to the root complex 1310 via the I/O bridge 1313 based on the I/O protocol CXL.io or the PCIe.

The memory resource 1330 may include a plurality of memory regions MR1, MR2, . . . , MRt and each of the plurality of memory regions MR1, MR2, . . . , MRt may be implemented as a memory of a various units. The memory resource 1330 may be a DRAM based volatile memory device.

The memory controller 1321 may provide the ECC engine 1322 with a read data read from the memory resource 1330. The ECC engine 1322 may perform an ECC decoding on the read data and may provide the read data to the erasure decoder 1324 when uncorrectable errors which cannot be corrected by ECC, are detected in the read data.

The erasure decoder 1324 may correct the uncorrectable errors in the read data by performing an erasure decoding on the read data and the memory controller 1321 may perform a soft PPR to replace a defect word-line of a first memory region of the memory resource 1330 with a redundancy word-line of a second memory region of the memory resource 1330, on memory resource 1330.

Figure 20:
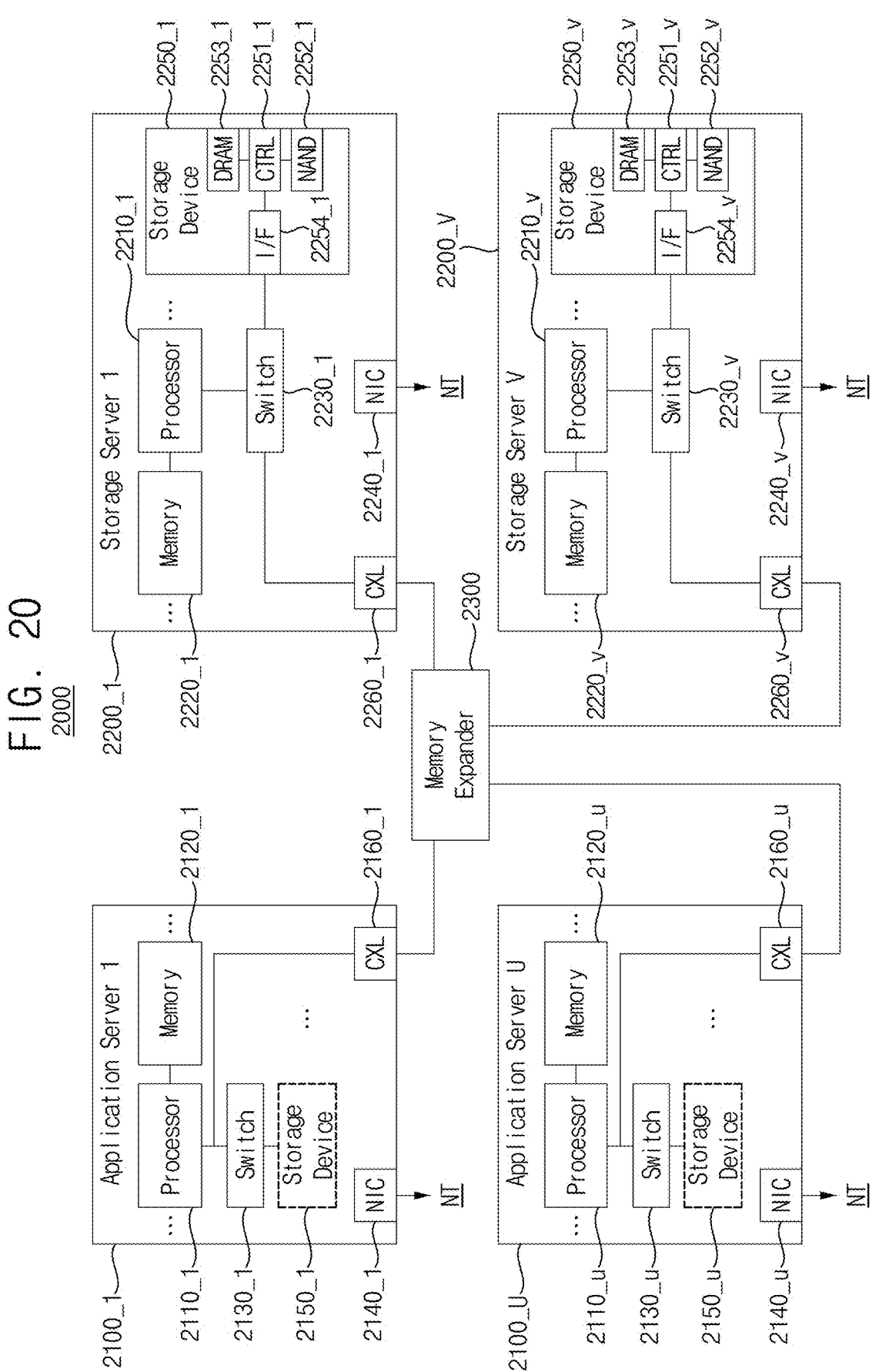
FIG. 20 is a block diagram illustrating an example of a data center including a computing system according to some implementations.

FIG. 20 is a block diagram illustrating an example of a data center including a computing system according to according to some implementations. In FIG. 20, a data center 2000 may be a facility that collects various types of data and provides various services, and may be referred to as a data storage center. The data center 2000 may be a system for operating search engines and databases, and may be a computing system used by companies such as banks or government agencies. The data center 2000 may include application servers 2100_1 to 2100_U and storage servers 2200_1 to 2200_V. The number of the application servers 2100_1 to 2100_U and the number of the storage servers 2200_1 to 2200_V may be variously selected according to some implementations, and the number of the application servers 2100_1 to 2100_U and the number of the storage servers 2200_1 to 2200_V m may be different from each other.

Below, for convenience of description, an example of the storage server 2200_1 will be described.

The storage server 2200_1 may include a processor 2210_1, a memory 2220_1, a switch 2230_1, a network interface controller (NIC) 2240_1, a storage device 2250_1 and CXL interface 2260_1. The storage server 2200_V may include a processor 2210_v, a memory 2220_v, a switch 2230_v, a NIC 2240_v, a storage device 2250_v and CXL interface 2260_v.

The processor 2210_1 may control overall operation of the storage server 2200_1. The memory 2220_1 may store various instructions or data under control of the processor 2210_1. The processor 2210_1 may be configured to access the memory 2220_1 to execute various instructions or to process data. In an embodiment, the memory 2220_1 may include at least one of various kind of memory devices such as double data rate synchronous DRAM (DDR SDRAM), high bandwidth memory (HBM), hybrid memory cube (HMC), dual in-line memory module (DIMM), Optane DIMM or non-volatile DIMM.

In some implementations, the number of the processors 2210_1 included in the storage server 2200_1 and the number of the memories 2220_1 included in the storage server 2200_1 may be variously changed or modified. In some implementations, the processor 2210_1 and the memory 2220_1 included in the storage server 2200_1 may constitute a processor-memory pair and the number of processor-memory pairs included in the storage server 2200_1 maybe variously changed or modified. In some implementations, the number of the processors 2210_1 included in the storage server 2200_1 and the number of the memories 2220_1 included in the storage server 2200_1 may be different. The processor 2210_1 may include a single core processor and a multi-core processor.

Under control of the processor 2210_1, the switch 2230_1 may selectively connect the processor 2210_1 and the storage device 2250_1 or may selectively connect the NIC 2240-1, the storage device 2250_1 and the CXL interface 2260_1.

The NIC 2240_1 may connect the storage server 2220_1 with a network NT. The NIC 2240_1 may include a network interface card, a network adapter, and the like. The NIC 2240_1 may be connected to the network NT through a wired interface, a wireless interface, a Bluetooth interface, or an optical interface. The NIC 2240_1 may include an internal memory, a digital signal processor (DSP), a host bus interface, and the like and may be connected with the processor 2210_1 or the switch 2230_1 through the host bus interface. The host bus interface may include at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, a compute express link (CXL), an IEEE 1394, a universal serial bus (USB), a secure digital (SD) card interface, a multimedia card (MMC) interface, an embedded MMC (eMMC) interface, a universal flash storage (UFS) interface, an embedded UFS (eUFS) interface, a compact flash (CF) card interface, etc. In some implementations, the NIC 2240_1 may be integrated with at least one of the processor 2210_1, the switch 2230_1 and the storage device 2250_1.

Under control of the processor 2210_1, the storage device 2250_1 may store data or may output the stored data. The storage device 2250_1 may include a controller CTRL 2251_1, a nonvolatile memory NAND 2252_1, a DRAM 2253_1 and an interface I/F 2254_1. In an embodiment, the storage device 2250_1 may further include a secure element SE for security or privacy. The storage device 2250_v may include a controller CTRL 2251_v, a nonvolatile memory NAND 2252_v, a DRAM 2253_v and an interface I/F 2254_v. In some implementations, the storage device 2250_v may further include a secure element SE for security or privacy.

The controller 2251_1 may control overall operation of the storage device 2250_1. The controller 2251_1 may include an SRAM. In response to signals received through the interface 2254_1, the controller 2251_1 may store data in the nonvolatile memory 2252_1 or may output data stored in the nonvolatile memory 2252_1. The controller 2251_1 may be configured to control the nonvolatile memory 2252_1 based on a toggle interface or an ONFI.

The DRAM 2253_1 may be configured to temporarily store data to be stored in the nonvolatile memory 2252_1 or data read from the nonvolatile memory 2252_1. The DRAM 2253_1 may be configured to store various data (e.g., metadata and mapping data) necessary of the controller 2251_1 to operate. The interface 2254_1 may provide a physical connection between the controller 2251_1 and the processor 2210_1, the switch 2230_1 or the NIC 2240_1. The interface 2254_1 may be implemented to support direct-attached storage (DAS) manner that allows the direct connection of the storage device 2250_1 through a dedicated cable. The interface 2254_1 may be implemented based on at least one of various above-described interfaces through a host interface bus.

The above components of the storage server 2200_1 are provided as an example, and the present disclosure is not limited thereto. The above components of the storage server 2200_1 may be applied to each of the other storage servers or each of the application servers 2100_1 to 2100_U. In each of the application servers 2100_1 to 2100_U, a storage device 2150_1 may be selectively omitted.

The application server 2100_1 may include a processor 2110_1, a memory 2120_1, a switch 2130_1, a NIC 2140_1, and CXL interface 2160_1. The application server 2100_U may include a processor 2110_u, a memory 2120_u, a switch 2130_u, a NIC 2140_1, and CXL interface 2160_u.

The application servers 2100_1 to 2100_U and the storage servers 2200_1 to 2200_V may communicate with each other through the network NT. The network NT may be implemented using a fiber channel (FC) or an Ethernet. The FC may be a medium used for a relatively high speed data transmission, and an optical switch that provides high performance and/or high availability may be used. The storage servers 2200_1 to 2200_V may be provided as file storages, block storages or object storages according to an access scheme of the network 3300.

In some implementations, the network NT may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In some implementations, the network NT may be a general network such as the TCP/IP network. For example, the network NT may be implemented according to at least one of protocols such as an FC over Ethernet (FCoE), a network attached storage (NAS), a nonvolatile memory express (NVMe) over Fabrics (NVMe-oF), etc.

In some implementations, at least one of the plurality of application servers 2100_1 to 2100_U may be configured to access at least one of the remaining application servers or at least one of the storage servers 2200_1 to 2200_V over the network NT. For example, the application server 2100_1 may store data requested by s user or a client in at least one of the storage servers 2200_1 to 2200_V over the network NT. Alternatively, the application server 2100_1 may obtain data requested by s user or a client in at least one of the storage servers 2200_1 to 2200_V over the network NT. In this case, the application server 2100_1 may be implemented with a web server, a database management system (DBMS), or the like.

The application server 2100_1 may access a memory 2120_1 or a storage device 2105_1 of the application server 2100_1 or the storage device 2250_1 of the storage server 2000_1 over the network NT. As such, the application server 2100_1 may perform various operations on data stored in the application servers 2100_1 to 2100_U and/or the storage servers 2200_1 to 2200_V. For example, the application server 2100_1 may execute a command for moving or copying data between the application servers 2100_1 to 2100_U and/or the storage servers 2200_1 to 2200_V. The data may be transferred from the storage devices 2250_1 to 2250_v of the storage servers 2200_1 to 2200_V to the memories 2120_1 to 2120_u of the application servers 2100_1 to 2100_U directly or through the memories 2220_1 to 2220_v of the storage servers 2200_1 to 2200_V. For example, the data transferred through the network NT may be encrypted data for security or privacy.

The storage servers 2200_1 to 2200_V and the application servers 2100_1 to 2100_U may be connected with a memory expander 2300 through the CXL interfaces 2260_1 to 2260_v and 2160_1 to 2160_u. The memory expander 2300 may be used as expanded memory of each of the storage servers 2200_1 to 2200_V and the application servers 2100_1 to 2100_U or virtualized component included therein may communicate with each other through the CXL interfaces 2260_1 to 2260_v and 2160_1 to 2160_u and the memory expander 2300.

Figure 21:
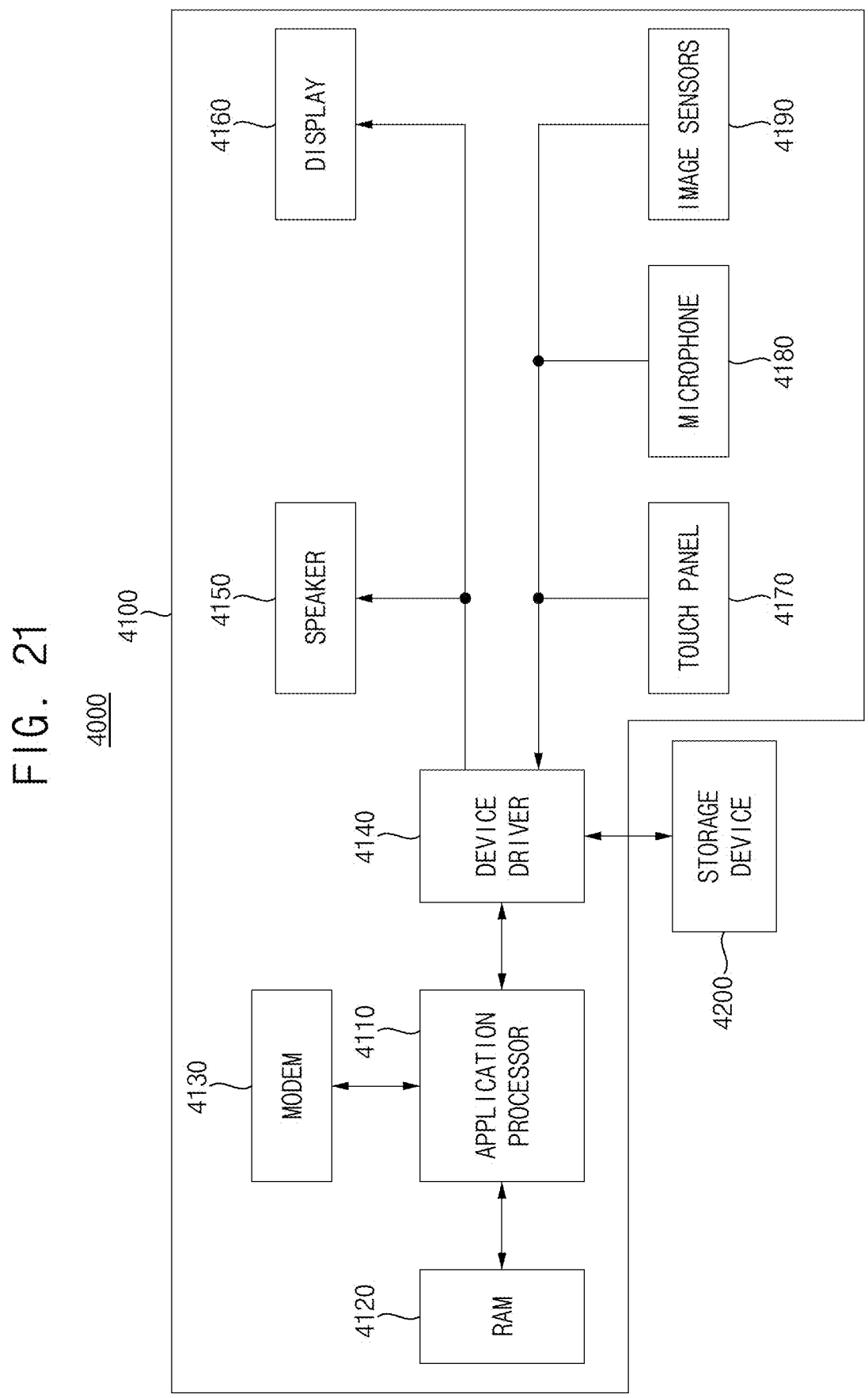
FIG. 21 is a block diagram illustrating an example of a storage system according to some implementations.

FIG. 21 is a block diagram illustrating an example of a storage system according to some implementations. In FIG. 21, a storage system 4000 may include a host 4100 and a storage device 4200. The host 4100 and the storage device 4200 may operate as described with reference to FIGS. 1 to 3.

The host 4100 may include an application processor 4110, a random access memory (RAM) 4120, a modem 4130, a device driver 4140, a speaker 4150, a display 4160, a touch panel 4170, a microphone 4180, and image sensors 4190.

The application processor 4110 may execute an application and a file system. The application processor 4110 may use the RAM 4120 as a system memory. The application processor 4110 may communicate with an external device through the modem 4130 in a wired fashion or wirelessly. For example, the modem 4130 may be embedded in the application processor 4110.

The application processor 4110 may communicate with peripheral devices through the device driver 4140. For example, the application processor 4110 may communicate with the speaker 4150, the display 4160, the touch panel 4170, the microphone 4180, the image sensors 4190, and the storage device 4200 through the device driver 4140.

The speaker 4150 and the display 4160 may be user output interfaces that transfer information to a user. The touch panel 4170, the microphone 4180, and the image sensors 4190 may be user input interfaces that receive information from the user.

The storage device 4200 may be a storage device according to some implementation. Accordingly, the storage device 4200 may include at least one nonvolatile memory device, a volatile memory device and a storage controller. The storage controller may include the memory controller, the ECC engine, the UE data buffer and the erasure decoder which are above-described and may perform above-mentioned ECC decoding, erasure decoding and soft PPR.

The present disclosure may be applied to various electronic devices including a storage device. For example, some implementations may be applied to systems, such as a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, a server system, an automotive driving system, etc.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A storage device comprising:
at least one nonvolatile memory device;
a volatile memory device; and
a storage controller configured to control the at least one nonvolatile memory device and the volatile memory device,
wherein the storage controller is configured to:
perform an error correction code (ECC) decoding on a read data that is read from the volatile memory device;
based on errors that are uncorrectable by the ECC decoding being detected in the read data, correct the errors to generate corrected data by performing an erasure decoding on the read data, wherein performing the erasure decoding comprises:
writing, as a written data pattern, a data pattern in a first memory region in which the errors are detected;
reading, as a read data pattern, the data pattern from the first memory region; and determining at least one erasure location in the read data based on comparing the written data pattern and the read data pattern;
replace a defective word-line of the first memory region with a redundancy word-line of a second memory region by performing a soft post package repair (PPR) on the first memory region that stores the read data;
store the corrected data in the second memory region; and
perform a re-read operation on the second memory region.

2. The storage device of claim 1, wherein the storage controller includes:
a central processing unit (CPU) configured to control operation of the storage controller;
a memory controller configured to perform an access operation on the volatile memory device;
an ECC decoder configured to:
receive the read data from the memory controller,
perform the ECC decoding on the read data, and
activate an error flag signal based on the errors being detected in the read data;
an uncorrectable error (UE) data buffer configured to store the read data in which the errors are detected; and
an erasure decoder configured to perform the erasure decoding on the read data stored in the UE data buffer.

3. The storage device of claim 2, wherein:
the memory controller is configured to provide an interrupt signal to the CPU based on receiving the activated error flag signal from the ECC decoder; and
the CPU is configured to enter the erasure decoder and the memory controller into a recovery process.

4. The storage device of claim 3,
wherein the memory controller is configured to, in the recovery process,
write the data pattern in the first memory region as the written data pattern;
read the data pattern from the first memory region as the read data pattern; and
provide the written data pattern and the read data pattern to the erasure decoder, and
wherein the erasure decoder is configured to, in the recovery process, perform the erasure decoding by:
determining the at least one erasure location in the read data stored in the UE data buffer;
estimating an error magnitude based on error positions in at least one target symbol corresponding to the at least one erasure location; and
correcting errors of the target symbol based on the estimated error magnitude.

5. The storage device of claim 4, wherein the erasure decoder is configured to determine the at least one erasure location by comparing the written data pattern and the read data pattern by unit of a symbol.

6. The storage device of claim 4, wherein the erasure decoder is configured to generate a corrected data by correcting error bits of the at least one target symbol corresponding to the at least one erasure location, in the read data stored in the UE data buffer.

7. The storage device of claim 4, wherein the erasure decoder is configured to:
generate a corrected data by correcting error bits of the at least one target symbol corresponding to the at least one erasure location, in the read data stored in the UE data buffer; and provide the memory controller with a result of the erasure decoding and the corrected data.

8. The storage device of claim 7, wherein the memory controller is configured to:

control the volatile memory device to perform the soft PPR, based on the result of the erasure decoding; and provide an interrupt termination signal to the CPU based on the soft PPR being completed.

9. The storage device of claim 7, wherein:

the CPU is configured to apply a command designating the re-read operation to the memory controller based on the interrupt signal; and the memory controller is configured to:

read the corrected data from the second memory region based on the command; and provide the CPU with the corrected data read from the second memory region.

10. The storage device of claim 1, wherein the storage controller is configured to store information associated with the soft PPR in the at least one nonvolatile memory device.

11. The storage device of claim 10, wherein the at least one nonvolatile memory device is configured to provide the volatile memory device with the information associated with the soft PPR after a power of the storage device is reset.

12. The storage device of claim 10, wherein the information associated with the soft PPR includes information on a defective address of the defective word-line of the first memory region and a replacement address of the redundancy word-line of the second memory region.

13. The storage device of claim 1, wherein the volatile memory device includes:

a memory cell array including a plurality of bank arrays, each of the plurality of bank arrays including a plurality of volatile memory cells coupled to a plurality of word-lines and a plurality of bit-lines;

a row decoder coupled to the memory cell array through the plurality of word-lines;

a control logic circuit configured to control access on the memory cell array based on a command and an address from the memory controller; and a repair controller configured to perform the soft PPR based on information associated with the soft PPR.

14. The storage device of claim 1, wherein information associated with the soft PPR includes information on a defective address of the defective word-line of the first memory region and a replacement address of the redundancy word-line of the second memory region, and wherein the repair controller is configured to:

store the information associated with the soft PPR therein; and based on an access address from the memory controller matching the defective address, provide a row decoder with the replacement address that replaces the defective address.

15. The storage device of claim 14, wherein the at least one nonvolatile memory device is configured to provide the repair controller with the information associated with the soft PPR after a power of the storage device is reset.

16. The storage device of claim 1, wherein:

the storage controller is connected to an external host through a compute express link (CXL) interface and is configured to process a request from the external host; and the nonvolatile memory device is configured to operate as a buffer memory configured to store data associated with an operation of the nonvolatile memory device.

17. A method of operating a storage device, comprising:

performing an error correction code (ECC) decoding on a read data that is read from a volatile memory device;

based on errors that are uncorrectable by the ECC decoding being detected in the read data, correcting the errors to generate corrected data by performing an erasure decoding on the read data, wherein performing the erasure decoding comprises:

writing, as a written data pattern, a data pattern in a first memory region in which the errors are detected;

reading, as a read data pattern, the data pattern from the first memory region; and determining at least one erasure location in the read data based on comparing the written data pattern and the read data pattern; and replacing, by the volatile memory device, a defective word-line of the first memory region with a redundancy word-line of a second memory region by performing a soft post package repair (PPR) on the first memory region that stores the read data.

18. The method of claim 17, further comprising:

copying data stored in the first memory region to a second memory region in the volatile memory device;

writing the corrected data in the second memory region; and performing a re-read operation on the second memory region.

19. The method of claim 17, further comprising:

storing information associated with the soft PPR in at least one nonvolatile memory device, and wherein performing the erasure decoding includes:

correcting error bits of at least one target symbol corresponding to the at least one erasure location, in the read data.

20. A storage device comprising:

at least one nonvolatile memory device;

a volatile memory device; and a storage controller configured to control the at least one nonvolatile memory device and the volatile memory device, wherein the storage controller includes:

a memory controller configured to perform an access operation on the volatile memory device, an error correction code (ECC) decoder configured to:

receive read data from the memory controller, perform the ECC decoding on the read data, and activate an error flag signal based on errors that are uncorrectable by the ECC decoding being detected in the read data, an uncorrectable error (UE) data buffer configured to store the read data in which the errors are detected, and an erasure decoder configured to correct the errors to generate corrected data by performing an erasure decoding on the read data stored in the UE data buffer, wherein performing the erasure decoding comprises:

writing, as a written data pattern, a data pattern in a first memory region in which the errors are detected;

reading, as a read data pattern, the data pattern from the first memory region; and determining at least one erasure location in the read data based on comparing the written data pattern and the read data pattern, and wherein the memory controller is configured to:

replace a defective word-line of the first memory region with a redundancy word-line of a second memory region by performing a soft post package repair on the first memory region that stores the read data in the volatile memory device, based on a result of the erasure decoding, store the corrected data in the second memory region, and perform a re-read operation on the second memory region.

* * * * *